(12) United States Patent
Iwata et al.

(10) Patent No.: US 8,475,593 B2
(45) Date of Patent: *Jul. 2, 2013

(54) CRYSTAL PREPARING DEVICE, CRYSTAL PREPARING METHOD, AND CRYSTAL

(75) Inventors: Hirokazu Iwata, Miyagi (JP); Seiji Sarayama, Miyagi (JP); Akihiro Fuse, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/170,431

(22) Filed: Jun. 28, 2011

(65) Prior Publication Data

US 2011/0253034 A1 Oct. 20, 2011

Related U.S. Application Data

(62) Division of application No. 11/684,724, filed on Mar. 12, 2007, now abandoned.

(30) Foreign Application Priority Data

Mar. 14, 2006 (JP) .................................. 2006-068614
Mar. 22, 2006 (JP) .................................. 2006-078173

(51) Int. Cl.
*C30B 9/00* (2006.01)
*C30B 11/00* (2006.01)

(52) U.S. Cl.
USPC .................. 117/81; 117/82; 117/83; 117/84; 117/85; 117/952

(58) Field of Classification Search
USPC ............................. 117/81, 82, 83, 84, 85, 952
See application file for complete search history.

(56) References Cited

U.S. PATENT DOCUMENTS

| 5,868,837 | A | 2/1999 | DiSalvo et al. |
| 6,592,663 | B1 * | 7/2003 | Sarayama et al. ............... 117/68 |
| 6,780,239 | B2 | 8/2004 | Sarayama et al. |
| 6,949,140 | B2 | 9/2005 | Sarayama et al. |

(Continued)

FOREIGN PATENT DOCUMENTS

| EP | 1 775 356 A2 | 4/2007 |
| EP | 1 881 094 A1 | 1/2008 |

(Continued)

OTHER PUBLICATIONS

Partial European Search Report issued Dec. 27, 2010, in Patent Application No. 07251077.9.

(Continued)

*Primary Examiner* — Matthew Song
(74) *Attorney, Agent, or Firm* — Oblon, Spivak, McClelland, Maier & Neustadt, L.L.P.

(57) ABSTRACT

In a crystal preparing device, a crucible holds a mixed molten metal containing alkali metal and group III metal. A container has a container space contacting the mixed molten metal and holds a molten alkali metal between the container space and an outside of the container, the molten alkali metal contacting the container space. A gas supply device supplies nitrogen gas to the container space. A heating device heats the crucible to a crystal growth temperature. The crystal preparing device is provided so that a vapor pressure of the alkali metal which evaporates from the molten alkali metal is substantially equal to a vapor pressure of the alkali metal which evaporates from the mixed molten metal.

5 Claims, 23 Drawing Sheets

U.S. PATENT DOCUMENTS

| | | |
|---|---|---|
| 7,001,457 B2 | 2/2006 | Sarayama et al. |
| 7,220,311 B2 | 5/2007 | Iwata et al. |
| 7,462,238 B2 | 12/2008 | Sarayama et al. |
| 7,905,958 B2 | 3/2011 | Sasaki et al. |
| 8,101,020 B2 * | 1/2012 | Sarayama et al. ............ 117/81 |
| 2004/0031437 A1 * | 2/2004 | Sarayama et al. ............ 117/36 |
| 2004/0134413 A1 | 7/2004 | Iwata et al. |
| 2004/0226503 A1 | 11/2004 | Iwata et al. |
| 2006/0048701 A1 | 3/2006 | Feigelson et al. |
| 2006/0130739 A1 | 6/2006 | Sarayama et al. |
| 2007/0034143 A1 | 2/2007 | Sarayama et al. |
| 2007/0084399 A1 | 4/2007 | Sarayama et al. |
| 2007/0194408 A1 * | 8/2007 | Iwata et al. .................. 257/613 |
| 2007/0296061 A1 | 12/2007 | Sasaki et al. |

FOREIGN PATENT DOCUMENTS

| | | |
|---|---|---|
| JP | 2000-12900 | 1/2000 |
| JP | 2001-58900 | 3/2001 |
| JP | 2001-64097 | 3/2001 |
| JP | 2001-64098 | 3/2001 |
| JP | 2001-102316 | 4/2001 |
| JP | 2001-119103 | 4/2001 |
| JP | 2002-128586 | 5/2002 |
| JP | 2002-134416 | 5/2002 |
| JP | 2002-201100 | 7/2002 |
| JP | 2002-326898 | 11/2002 |
| JP | 2002-338397 | 11/2002 |
| JP | 2003-12400 | 1/2003 |
| JP | 2003-81696 | 3/2003 |
| JP | 2003-160398 | 6/2003 |
| JP | 2003-160399 | 6/2003 |
| JP | 2003-206198 | 7/2003 |
| JP | 2003-212696 | 7/2003 |
| JP | 2003-238296 | 8/2003 |
| JP | 2003-286098 | 10/2003 |
| JP | 2003-286099 | 10/2003 |
| JP | 2003-292400 | 10/2003 |
| JP | 2003-300798 | 10/2003 |
| JP | 2003-300799 | 10/2003 |
| JP | 2003-313097 | 11/2003 |
| JP | 2003-313098 | 11/2003 |
| JP | 2003-313099 | 11/2003 |
| JP | 2004-168650 | 6/2004 |
| JP | 2004-189590 | 7/2004 |
| JP | 2004-231447 | 8/2004 |
| JP | 2004-277224 | 10/2004 |
| JP | 2004-307322 | 11/2004 |
| JP | 3631724 | 12/2004 |
| JP | 2005-206415 | 8/2005 |
| JP | 2005-247657 | 9/2005 |
| JP | 2005-263571 | 9/2005 |
| WO | WO 2004/061923 A1 | 7/2004 |
| WO | WO 2005/100647 A1 | 10/2005 |
| WO | WO 2005/111278 A1 | 11/2005 |

OTHER PUBLICATIONS

Extended European Search Report issued Apr. 6, 2011, in Patent Application No. 07251077.9.

* cited by examiner

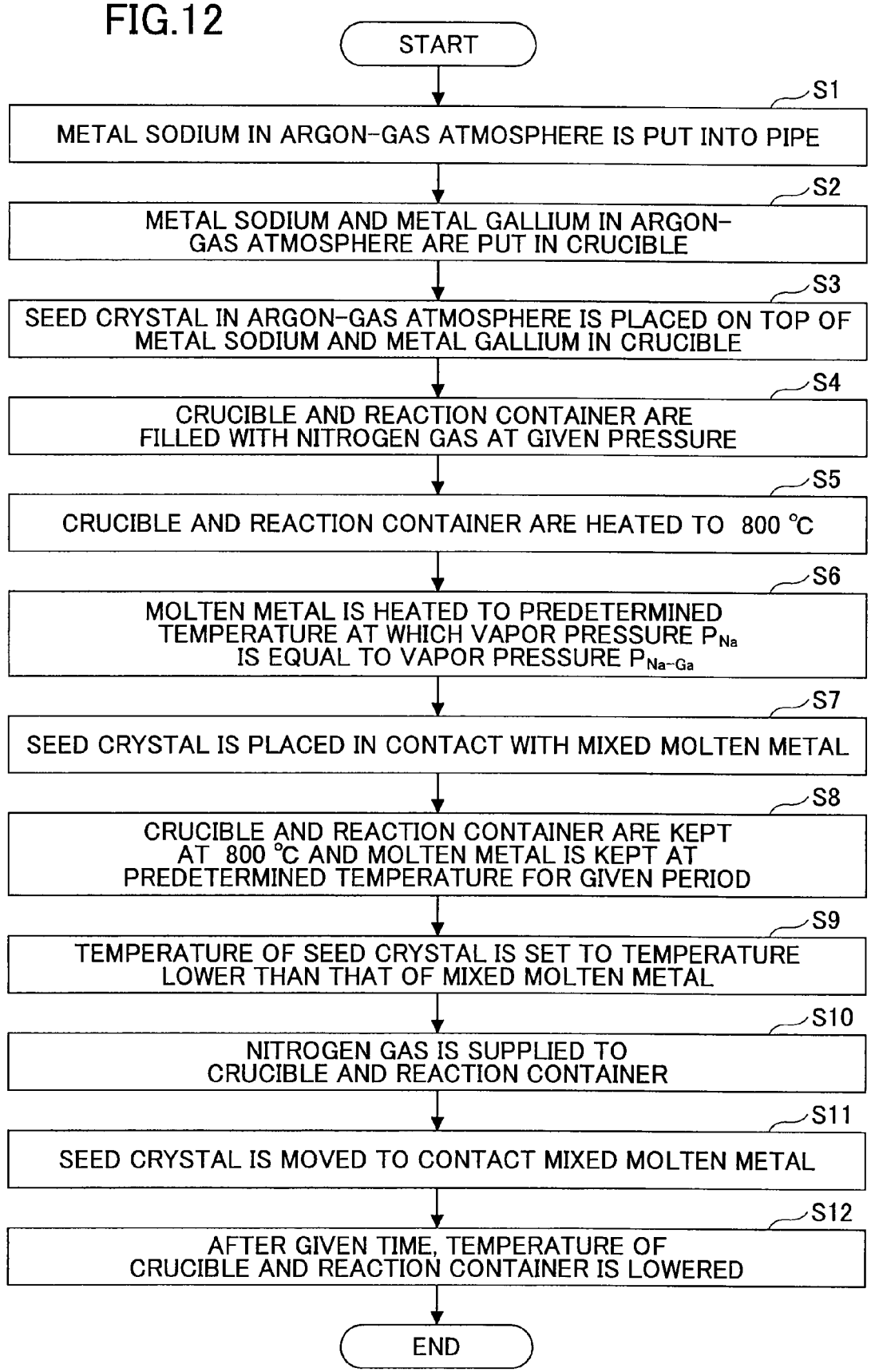

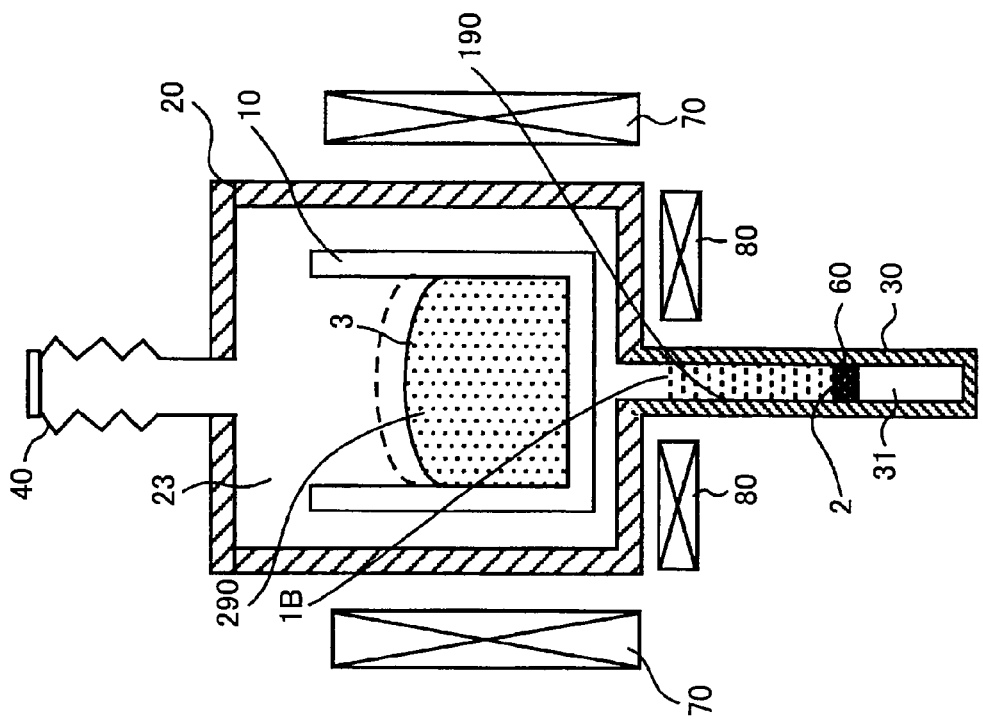
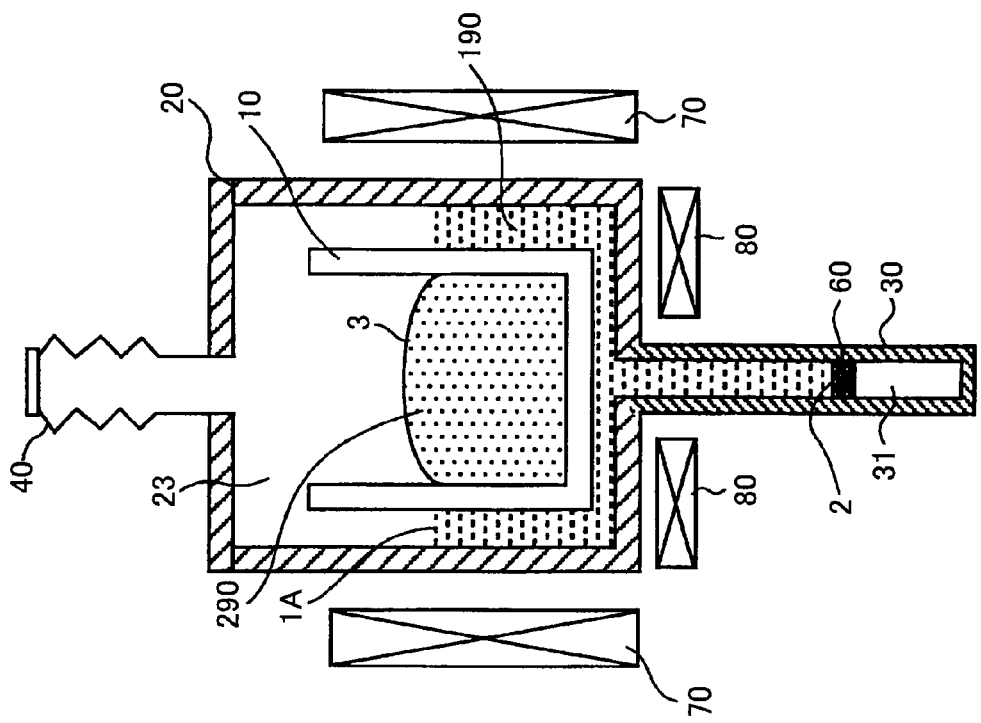

CRYSTAL PREPARING DEVICE, CRYSTAL PREPARING METHOD, AND CRYSTAL

CROSS REFERENCE TO RELATED APPLICATIONS

The present application is a Divisional of U.S. application Ser. No. 11/684,724, filed Mar. 12, 2007, abandoned, the entire contents of which are hereby incorporated by reference. Further, the present application is based on and claims the benefit of priority of Japanese patent application No. 2006-068614, filed on Mar. 14, 2006, and Japanese patent application No. 2006-078173, filed on Mar. 22, 2006, the entire contents of which are hereby incorporated by reference.

BACKGROUND OF THE INVENTION

1. Field of the Invention

The present invention relates to a crystal preparing device which carries out crystal growth of a group III nitride crystal, and a crystal preparing method which carries out crystal growth of a group III nitride crystal.

2. Description of the Related Art

Most of InGaAlN devices (or group III nitride semiconductor devices) which are currently used as ultraviolet, purple, blue, or green light sources are produced by carrying out crystal growth of a group III nitride crystal on a sapphire or silicone carbide (SiC) substrate by using the MOCVD method (organic metal chemical vapor deposition), the MBE method (molecular beam crystal growth method), etc.

When sapphire and silicone carbide are used as the substrate in this case, the substrate and the group III nitride semiconductor greatly differ in the coefficient of thermal expansion and the grating constant, and many crystal defects will be included in the group III nitride semiconductor. Such crystal defects relate directly to the drawbacks which cause deterioration of the device characteristics, for example, short operating life and heavy operation power in a luminescence device.

A sapphire substrate is an insulator, and taking out electrodes from such a substrate as in the conventional luminescence devices is impossible. Thus, it is necessary to take out electrodes from the group III nitride semiconductor. As a result, the area of the semiconductor device becomes large and there is a problem that the semiconductor device must be produced with high cost. Moreover, if the area of the semiconductor device becomes large, another problem of a curvature of the substrate may arise due to the use of the combination of different materials: the substrate and the group III nitride semiconductor.

Moreover, in the case of the group III nitride semiconductor device produced on the sapphire substrate, performing the chip separation by cleavage is difficult and preparing the resonator end surface needed for a laser diode (LD) is difficult.

For this reason, currently, the sapphire substrate is ground or dry etched to a thickness of 100 micrometers or less, and then the chip separation is performed in a manner analogous to that of the cleavage separation so that the resonator end surface is formed. Therefore, it is difficult to perform the formation of the resonator end surface and the chip separation at a single process as in the conventional laser diode (LD), which will increase the manufacturing cost due to complication of the processes.

In order to obviate the problems, there is proposed an improved method in which a group III nitride semiconductor is selectively grew up in a transverse direction on the sapphire substrate, in order to reduce the amount of crystal defects included in the group III nitride semiconductor. Although it is possible to reduce the amount of crystal defects by using the improved method, the above problems related to the dielectric feature of the sapphire substrate and the difficulty of the cleavage separation still remain.

One method to solve the above problems is to use a gallium nitride (GaN) substrate which is of the same material as the crystal which is subjected to crystal growth on the substrate. For this reason, there are proposed various methods of carrying out crystal growth of a bulk GaN through vapor growth, molten metal growth, etc. However, a GaN substrate which has good quality and practical size is not yet realized.

As one method of realizing a GaN substrate, there is proposed a GaN crystal growth method which uses sodium (Na) as flux. See U.S. Pat. No. 5,868,837. In this method, sodium azide (NaN3) and metal Ga are used as raw materials, NaN3 and metal Ga are placed into a reaction container made of stainless steel (the inside dimensions of the container: inside diameter=7.5 mm, length=100 mm) in a nitrogen atmosphere, and the reaction container is held at the temperature of 600-800 degrees C. for 24 to 100 hours, so that a GaN crystal grows.

According to the above-mentioned method, the crystal growth in a range of comparatively low temperatures: 600-800 degrees C. is attained, and the internal pressure of the container is about 100 kg/cm$^2$ which is comparatively low. Thus, the above-mentioned method provides practical crystal growth conditions.

Moreover, there is recently proposed a crystal preparing method in which a mixed molten metal containing alkali metal and group III metal is made to react with a group V raw material including nitrogen, so that a quality group III nitride crystal is prepared. See Japanese Laid-Open Patent Application No. 2001-058900.

Moreover, there is also proposed a crystal preparing method in which a mixed molten metal containing metal Na and metal Ga is put into a crucible, the crucible is placed in a reaction container, and molten metal Na is held outside the crucible and within the reaction container. By raising the vapor pressure of the molten metal Na, crystal growth of a GaN crystal is carried out. See Japanese Laid-Open Patent Application No. 2005-263571.

However, the conventional crystal preparing devices which carry out crystal growth of a GaN crystal have a problem that holding the mixing ratio of metal Na and metal Ga in the mixed molten metal at a controlled ratio during the crystal growth of a GaN crystal is difficult. There may be the case in which the vapor pressure of metal Na is too high so that the vapor is spread from the mixed molten metal to the exterior. Conversely, there may be also the case in which the vapor pressure of metal Na is too low so that the vapor is diffused from the exterior to the mixed molten metal.

Moreover, metal Ga is consumed out of the mixed molten metal with the progress of preparation of crystal growth. As a result, it is difficult to maintain the mixing ratio of metal Na and metal Ga in the mixed molten metal at a controlled ratio stably.

SUMMARY OF THE INVENTION

According to one aspect of the invention, there is provided an improved crystal preparing device and method in which the above-described problems are eliminated.

According to one aspect of the invention there is provided a crystal preparing device which stably holds the mixing ratio of an alkali metal and a group III metal at a controlled ratio and carries out crystal growth of a group III nitride crystal.

According to one aspect of the invention there is provided a crystal preparing method which stably holds the mixing ratio of an alkali metal and a group III metal at a controlled ratio to produce a group III nitride crystal.

In an embodiment of the invention which solves or reduces one or more of the above-mentioned problems, there is provided a crystal preparing device comprising: a crucible holding a mixed molten metal containing alkali metal and group III metal; a reaction container having a container space which contacts the mixed molten metal and holding a molten alkali metal between the container space and an outside of the container, the molten alkali metal contacting the container space; a gas supply device supplying a nitrogen gas to the container space; and a heating device heating the crucible to a crystal growth temperature, wherein the crystal preparing device is provided so that a vapor pressure of the alkali metal which evaporates from the molten alkali metal is substantially equal to a vapor pressure of the alkali metal which evaporates from the mixed molten metal.

In an embodiment of the invention which solves or reduces one or more of the above-mentioned problems, there is provided a crystal preparing method which produces a group III nitride crystal using a crystal preparing device, the crystal preparing device including a crucible holding a mixed molten metal containing alkali metal and group III metal, a reaction container having a container space which contacts the mixed molten metal and holding a molten alkali metal between the container space and an outside of the container, the molten alkali metal contacting the container space, and a piping disposed below the crucible and connected with the reaction container, the crystal preparing method comprising: a first step of placing the alkali metal and the group III metal into the crucible in an inert gas or nitrogen gas atmosphere; a second step of placing the alkali metal into the piping in the inert gas or nitrogen gas atmosphere; a third step of filling the container space of the reaction container with nitrogen gas; a fourth step of heating the crucible to a crystal growth temperature; a fifth step of heating the molten alkali metal at a specific temperature at which a vapor pressure of the alkali metal which evaporates from the molten alkali metal is substantially equal to a second vapor pressure of the alkali metal which evaporates from the mixed molten metal; and a sixth step of holding a temperature of the crucible to the crystal growth temperature, and holding a temperature of the molten alkali metal to the specific temperature for a predetermined time.

According to the embodiments of the crystal preparing device and method of the invention, a vapor pressure of alkali metal which evaporates from a mixed molten metal containing alkali metal and group III metal and a vapor pressure of alkali metal which evaporates from a molten alkali metal are substantially equal to each other, and a group III nitride crystal is produced through crystal growth. In this case, movement of alkali metal from the mixed molten metal to the molten alkali metal and movement of alkali metal from the molten alkali metal to the mixed molten metal are balanced during the crystal growth of the group III nitride crystal. Therefore, according to the embodiments of the invention, the mixing ratio of the alkali metal and the group III metal in the mixed molten metal can be held at a controlled ratio.

In an embodiment of the invention which solves or reduces one or more of the above-mentioned problems, there is provided a crystal preparing method which produces a group III nitride crystal using a crystal preparing device including a reaction container holding a mixed molten metal containing alkali metal and group III metal, the crystal preparing method comprising: a first step of placing the alkali metal and the group III metal in a reaction container in an inert gas or nitrogen gas atmosphere containing a predetermined amount of impurities; a second step of filling a container space of the reaction container with nitrogen gas; a third step of heating the reaction container to a crystal growth temperature; a fourth step of holding a temperature of the reaction container at the crystal growth temperature for a predetermined time; and a fifth step of supplying nitrogen gas to the reaction container to hold a pressure in the container space of the reaction container at a predetermined pressure.

In an embodiment of the invention which solves or reduces one or more of the above-mentioned problems, there is provided a group III nitride crystal containing group III metal and nitrogen, wherein the group III nitride crystal has a dislocation density of $10^3$ $cm^{-2}$ or less and contains oxygen in a concentration of $10^{20}$ $cm^{-3}$ or less.

According to the embodiments of the invention, a group III nitride crystal is produced by placing alkali metal and group III metal in an inert gas or nitrogen gas atmosphere containing oxygen and/or moisture in a concentration of 10 ppm or less. As a result, the group III nitride crystal having a dislocation density of $10^3$ $cm^{-2}$ or less and containing oxygen of $10^{20}$ $cm^{-3}$ or less, or the group III nitride crystal having a dislocation density of $10^3$ $cm^{-2}$ or less and containing oxygen of $10^{20}$ $cm^{-3}$ or less and hydrogen of $10^{20}$ $cm^{-3}$ or less is produced. Therefore, according to the embodiments of the invention, the group III nitride crystal suitable for use in optical devices or electronic devices can be produced.

Moreover, according to the embodiments of the invention, the group III nitride crystal has a dislocation density of $10^3$ $cm^{-2}$ or less and contains oxygen in a concentration of $10^{20}$ $cm^{-3}$ or less. Moreover, the group III nitride crystal has a dislocation density of $10^3$ $cm^{-2}$ or less and contains oxygen of $10^{20}$ $cm^{-3}$ or less and hydrogen of $10^{20}$ $cm^{-3}$ or less. As a result, it is possible to produce any of an insulator containing a group III nitride crystal, a group III nitride semiconductor with a low resistance, and a group III nitride semiconductor with a high resistance. Therefore, according to the embodiments of the invention, the resulting group III nitride crystal can be used for optical devices or electron devices.

BRIEF DESCRIPTION OF THE DRAWINGS

Other objects, features and advantages of the present invention will be apparent from the following detailed description when reading in conjunction with the accompanying drawings.

FIG. 12 is a flowchart for explaining the crystal preparing method of a GaN crystal.

FIG. 13A and FIG. 13B are diagrams for explaining the amount of metal Na.

DETAILED DESCRIPTION OF PREFERRED EMBODIMENTS

A description will be given of embodiments of the invention with reference to the accompanying drawings.

Figure 1:
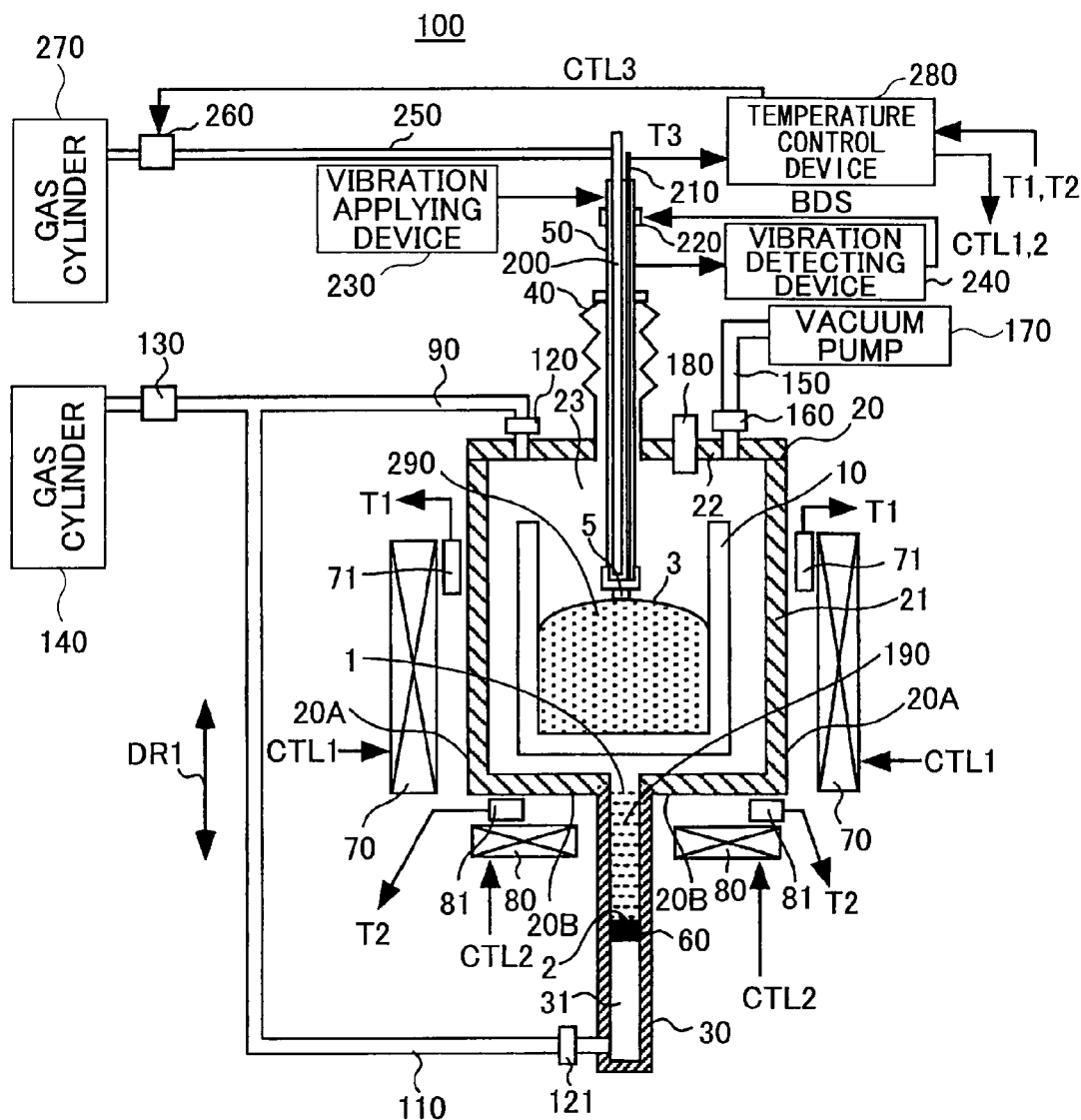
FIG. 1 is a diagram showing the composition of a crystal preparing device in an embodiment of the invention.

FIG. 1 shows the composition of a crystal preparing device in an embodiment of the invention. As shown in FIG. 1, the crystal preparing device 100 of this embodiment includes a crucible 10, a reaction container 20, piping 30, piping 200, a bellows 40, a supporting device 50, a molten metal holding member 60, heating devices 70,80, temperature sensors 71,81, gas supply lines 90,110,250, valves 120,121,160, a pressure regulator 130, gas cylinders 140,270, an exhaust pipe 150, a vacuum pump 170, pressure sensor 180, molten metal 190, a thermocouple 210, an up-and-down movement device 220, a vibration applying device 230, a vibration detecting device 240, a flowmeter 260, and a temperature control device 280.

The crucible 10 has a generally cylindrical shape and is made of boron nitride (BN) or stainless steel (SUS316L). The reaction container 20 is arranged around the crucible 10 with a given interval separate from the crucible 10. Namely, the reaction container 20 accommodates the crucible 10 inside the reaction container 20. The reaction container 20 includes a body part 21 and a lid part 22. Each of the body part 21 and the lid part 22 is made of stainless steel (SUS316L). The reaction container 20 is sealed by a metal O-ring (not shown) disposed between the body part 21 and the lid part 22.

The piping 30 extends from the bottom of the reaction container 20 in gravity direction DR1, and one end of the piping 30 is connected with the inside of the reaction container 20 on the bottom of the crucible 10 and the other end thereof is connected with the gas supply line 110.

The bellows 40 extends from the top of the reaction container 20 in gravity direction DR1 and is connected with the reaction container 20 on the top of the crucible 10. The supporting device 50 is in the form of a hollow cylinder, and the lower half of the supporting device 50 is inserted into space 23 of the reaction container 20 through the bellows 40.

The molten metal holding member 60 is made of, for example, a metal, ceramics, etc., and disposed in the piping 30 at a location below the connection part of the reaction container 20 and the piping 30.

The heating devices 70 are arranged so that the outer peripheral surface 20A of the reaction container 20 is surrounded by the arranged so that they confront the bottom 20B of the reaction container 20. The temperature sensors 71 and 81 are arranged in the vicinity of the heating devices 70 and 80, respectively.

The gas supply line 90 is arranged so that one end of the gas supply line 90 is connected with the reaction container 20 through the valve 120 and the other end thereof is connected with the gas cylinder 140 through the pressure regulator 130.

The gas supply line 110 is arranged so that one end of the gas supply line 110 is connected with the piping 30 through the valve 121 and the other end thereof is connected with the gas supply line 90.

The valve 120 is disposed to the gas supply line 90 near the reaction container 20. The pressure regulator 130 is disposed to the gas supply line 90 near the gas cylinder 140. The gas cylinder 140 is connected with the gas supply line 90.

The exhaust pipe 150 is arranged so that one end of the exhaust pipe 150 is connected with the reaction container 20 through the valve 160, and the other end thereof is connected with the vacuum pump 170. The valve 160 is disposed to the exhaust pipe 150 with near the reaction container 20. The vacuum pump 170 is connected with the exhaust pipe 150.

The pressure sensor 180 is attached to the reaction container 20. The molten metal 190 includes molten metal sodium (Na) and is held in the piping 30 by the molten metal holding member 60.

The piping 200 and the thermocouple 210 are inserted in the inside of the supporting device 50. The up-and-down mechanism 220 is attached to the supporting device 50 above the bellows 40. The gas supply line 250 is arranged so that one end of the gas supply line 250 is connected with the piping 200 and the other end thereof is connected with the gas cylinder 270 through the flowmeter 260. The flowmeter 260 is disposed to the gas supply line 250 near the gas cylinder 270. The gas cylinder 270 is connected with the gas supply line 250.

The crucible 10 holds a mixed molten metal 290 containing metal Na and metal Ga. The reaction container 20 covers the circumference of the crucible 10. The piping 30 holds molten metal 190. The bellows 40 holds the supporting device 50 and intercepts the inside and the outside of the reaction container 20. The bellows 40 is expanded or contracted in gravity direction DR1 in accordance with movement of the supporting device 50 in gravity direction DR1. The supporting device 50 supports a seed crystal (GaN crystal) 5 at its bottom end which is inserted into the reaction container 20.

The molten metal holding member 60 has a concavo-convex structure on the outer peripheral surface so that a number of small holes on the order of tens of micrometers are formed between the holding member 60 and the inner wall of the piping 30. The nitrogen gas supplied to the space 31 in the piping 30 passes through the small holes of the holding member 60 in the direction to the molten metal 190, so that the nitrogen gas is supplied to the space 23 of the reaction container 20 through the molten metal 190. The molten metal holding member 60 holds the molten metal 190 in the piping 30 by the surface tension of the molten metal 190.

Each of the heating devices 70 includes a heater and a current source. According to a control signal CTL1 from the temperature control device 280, the current source of each heating device 70 supplies electric current through the heater, so that the heating devices 70 heat the crucible 10 and the reaction container 20 from the outer peripheral surface 20A of the reaction container 20 to a crystal growth temperature.

The temperature sensor 71 detects a temperature T1 of the heater of each heating device 70, and outputs the detected temperature T1 to the temperature control device 280.

Each of the heating devices 80 also includes a heater and a current source. According to a control signal CTL2 from the temperature control device 280, the current source of each heating device 80 supplies electric current through the heater, so that the heating devices 80 heat the crucible 10 and the reaction container 20 from the bottom 20B of the reaction container 20 to a crystal growth temperature.

The temperature sensor 81 detects a temperature T2 of the heater of each heating device 80, and outputs the detected temperature T2 to the temperature control device 280.

The gas supply line 90 supplies the nitrogen gas which is fed through the pressure regulator 130 from the gas cylinder 140, to the reaction container 20 through the valve 120. The gas supply line 110 supplies the nitrogen gas which is fed through the pressure regulator 130 from the gas cylinder 140, to the piping 30 through the valve 121.

The valve 120 supplies the nitrogen gas in the gas supply line 90 to the reaction container 20, or suspends the supply of the nitrogen gas to the reaction container 20. The pressure regulator 130 regulates the nitrogen gas from the gas cylinder 140 at a predetermined pressure, and supplies the nitrogen gas under the regulated pressure to the gas supply lines 90,110.

The gas cylinder 140 holds nitrogen gas. The exhaust pipe 150 passes the gas in the reaction container 20 to the vacuum pump 170. The valve 160 connects the exhaust pipe 150 and the reaction container 20 spatially, or intercepts the exhaust pipe 150 and the reaction container 20 spatially. The vacuum pump 170 performs vacuum suction in the reaction container 20 through the exhaust pipe 150 and the valve 160.

The pressure sensor 180 detects the pressure in the reaction container 20. The molten metal 190 serves to supply the nitrogen gas entered through the molten metal holding member 60, to the space 23 of the reaction container 20.

The piping 200 supplies the nitrogen gas fed from the gas supply line 250 to one end of the piping 200, to the supporting device 50, in order to cool the seed crystal 5. The thermocouple 210 detects a temperature T3 of the seed crystal 5, and outputs the detected temperature T3 to the temperature control device 280.

According to a vibration detection signal BDS from the vibration detecting device 240, the up-and-down movement device 220 moves up or down the supporting device 50 so that the seed crystal 5 may touch the gas-liquid interface 3 of the space 23 and the mixed molten metal 290.

The vibration applying device 230 includes, for example, a piezoelectric element and applies vibrations having a predetermined frequency to the supporting device 50. The vibration detecting device 240 includes, for example, an acceleration pickup and detects the vibrations of the supporting device 50. The vibration detecting device 240 outputs the vibration detection signal BDS, indicating the vibrations of the supporting device 50, to the up-and-down movement device 220.

The gas supply line 250 supplies the nitrogen gas fed through the flowmeter 260 from the gas cylinder 270, to the piping 200. The flowmeter 260 adjusts the flow rate of the nitrogen gas supplied from the gas cylinder 270, according to a control signal CTL3 from the temperature control device 280, and supplies the nitrogen gas to the gas supply line 250 at the controlled flow rate. The gas cylinder 270 holds nitrogen gas.

The temperature control device 280 receives the detected temperatures T1, T2, and T3 from the temperature sensors 71 and 81 and the thermocouple 210, respectively, and generates the control signals CTL1-CTL3 based on the received temperatures T1, T2, and T3.

The temperature control device 280 outputs the generated control signals CTL1 and CTL2 to the heating devices 70 and 80, respectively, and outputs the generated control signal CTL3 to the flowmeter 260.

Figure 2:
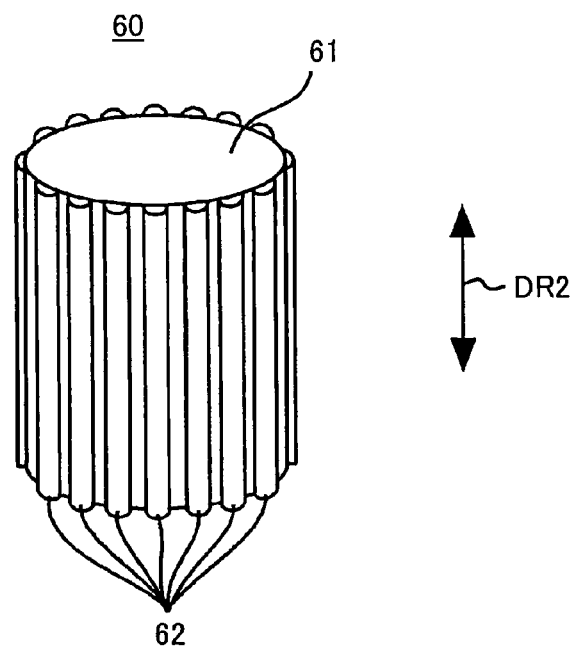
FIG. 2 is a perspective view of the molten metal holding member shown in FIG. 1.

FIG. 2 is a perspective view of the molten metal holding member 60 in FIG. 1. As shown in FIG. 2, the molten metal holding member 60 includes a plug 61 and a number of projections 62. The plug 61 has a generally cylindrical shape. Each of the projections 62 has a cross-section in the form of a semi-circle, and is formed on the outer peripheral surface of the plug 61 along the longitudinal direction DR2 of the plug 61.

Figure 3:
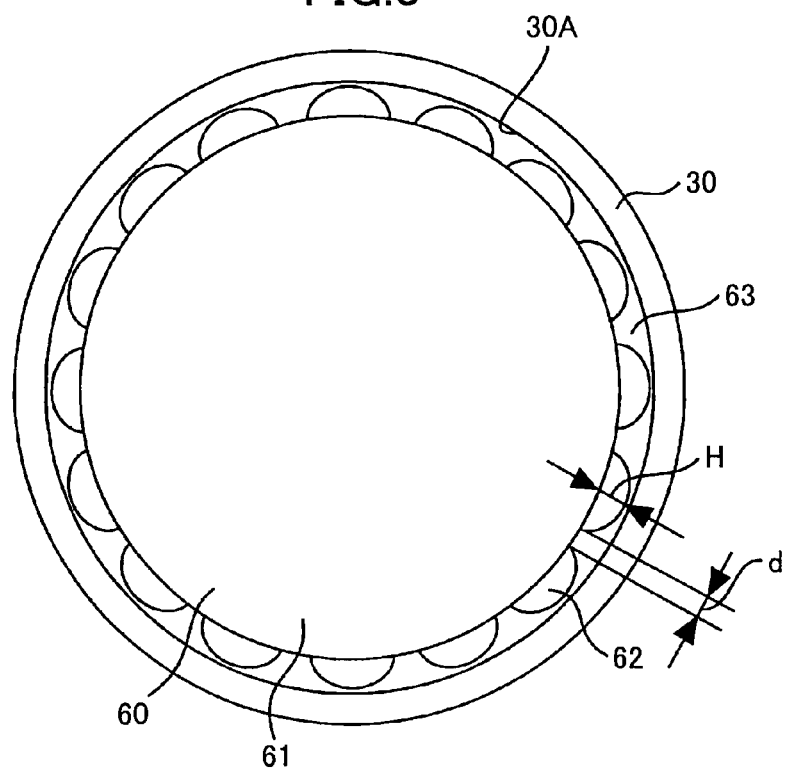
FIG. 3 is a plan view showing the mounting state of the molten metal holding member to piping.

FIG. 3 is a plan view showing the mounting state of the molten metal holding member 60 to the piping 30. As shown in FIG. 3, the plurality of projections 62 are arranged in the circumferential direction of the plug 61 at intervals "d" on the order of tens of micrometers. Each of the projections 62 has a height H from the outer peripheral surface of the plug 61 on the order of tens of micrometers. The projections 62 of the molten metal holding member 60 touch the inner wall 30A of the piping 30. Thereby, the molten metal holding member 60 is fitted into the inner wall 30A of the piping 30.

Since the projections 62 have the height H on the order of tens of micrometers and are arranged at the intervals d on the order of tens of micrometers on the outer peripheral surface of the plug 61, a number of voids 63 each having a diameter on the order of tens of micrometers are formed between the molten metal holding member 60 and the inner walls 30A of the piping 30 when the molten metal holding member 60 is fitted into the inner wall 30A of the piping 30.

This void 63 serves to pass nitrogen gas through it in the longitudinal direction DR2 of the plug 61, and serves to hold the molten metal 190 by the surface tension of the molten metal 190, thereby preventing the passing of the molten metal 190 in the longitudinal direction DR2 of the plug 61.

Figure 4A:
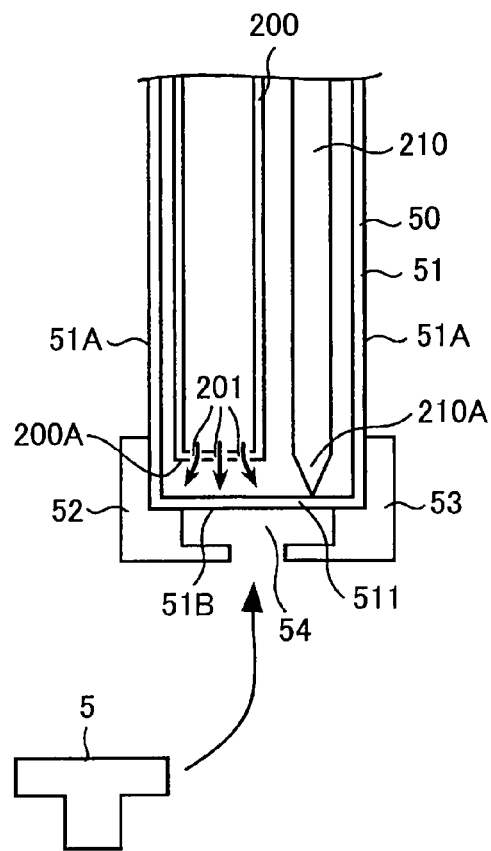
FIG. 4A and FIG. 4B are enlarged views of the supporting device, the piping, and the thermocouple shown in FIG. 1.
Figure 4B:
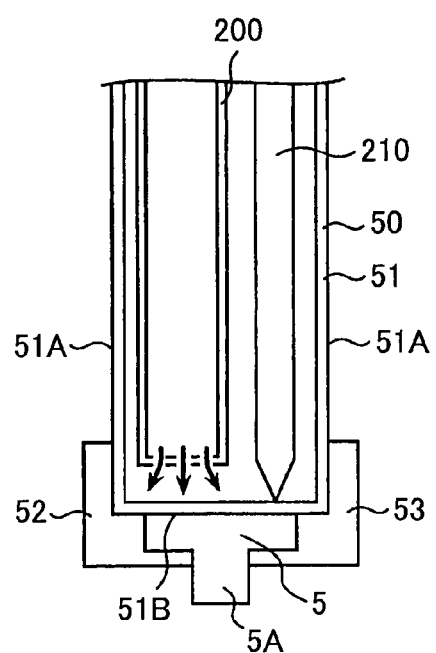

FIG. 4A and FIG. 4B are enlarged views of the supporting device 50, the piping 200, and the thermocouple 210 shown in FIG. 1. As shown in FIG. 4A and FIG. 4B, the supporting device 50 includes a cylindrical member 51 and holding members 52 and 53.

The cylindrical member 51 has a generally circular cross-section. The holding member 52 has a generally L-shaped cross-section, and is fixed at one end 511 of the cylindrical member 51 to the outer peripheral surface 51A and the bottom 51B of the cylindrical member 51. The holding member 53 has a generally L-shaped cross section, and is fixed at one end 511 of the cylindrical member 51 to the outer peripheral surface 51A and the bottom 51B of the cylindrical member 51. The holding members 52 and 53 are arranged symmetrically about the centerline of the cylindrical member 51. As a result, a space 54 is formed in the area that is surrounded by the cylindrical member 51 and the holding members 52 and 53.

The piping 200 has a generally circular cross-section and is arranged inside the cylindrical member 51. In this case, the bottom 200A of the piping 200 is arranged so that it confronts the bottom 51B of the cylindrical member 51. A plurality of holes 201 are formed in the bottom 200A of the piping 200. The nitrogen gas supplied to the piping 200 is sprayed through the holes 201 to the bottom 51B of the cylindrical member 51.

The thermocouple 210 is arranged inside the cylindrical member 51 so that one end 210A of the thermocouple 210 touches the bottom 51B of the cylindrical member 51 (see FIG. 4A).

The seed crystal 5 is configured so that it is fitted into the space 54 and supported by the supporting device 50 through the fitting of the seed crystal 5 to the space 54. In this case, the seed crystal 5 touches the bottom 51B of the cylindrical member 51 (see FIG. 4B).

Therefore, the heat conductivity between the seed crystal 5 and the cylindrical member 51 is raised. As a result, the temperature of the seed crystal 5 can be detected by the thermocouple 210, and the seed crystal 5 can be easily cooled with the nitrogen gas sprayed from the piping 200 to the bottom 51B of the cylindrical member 51.

In this embodiment, the seed crystal itself is configured so that it is fitted into the supporting device 50 like the seed crystal 5. Alternatively, a hexagon-shaped seed crystal may be held through an adapter having the form of the seed crystal 5, if it is configured to touch the supporting device 50.

Figure 5:
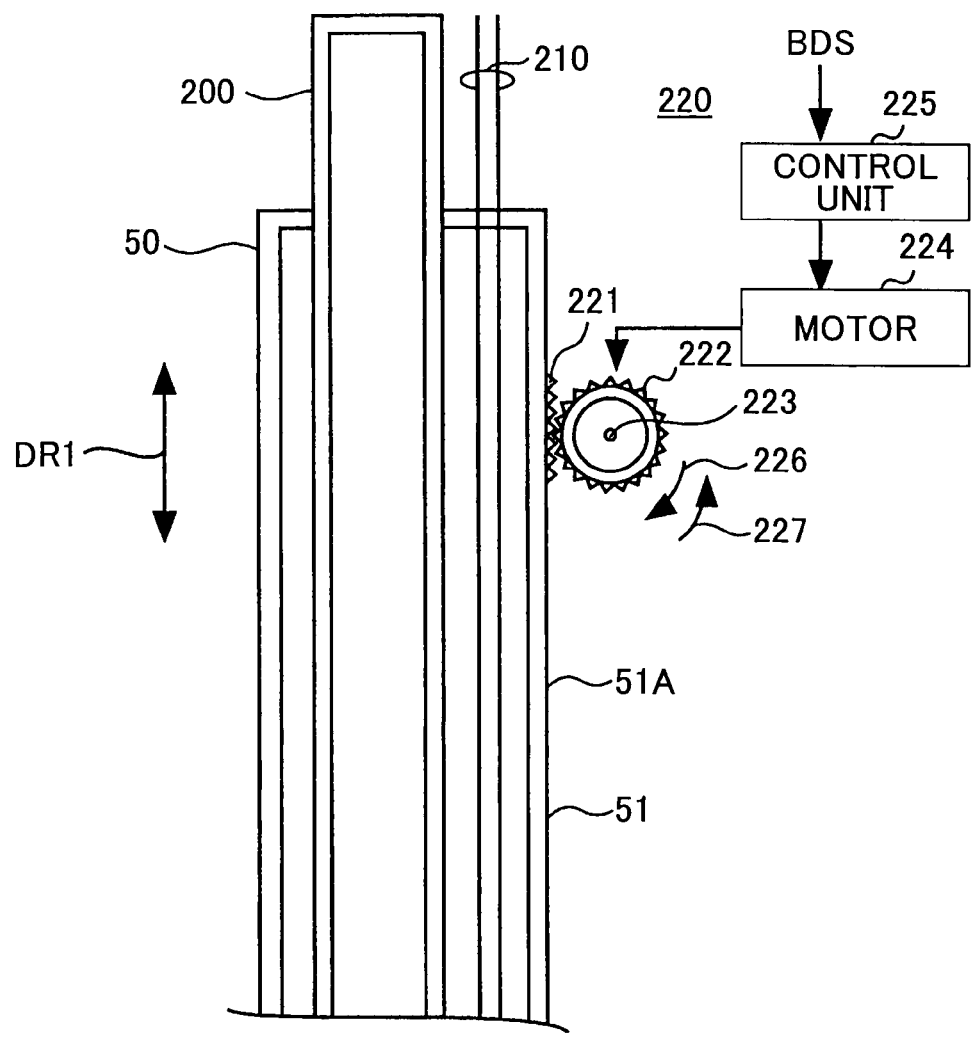
FIG. 5 is a diagram showing the composition of an up-and-down movement device shown in FIG. 1.

FIG. 5 shows the composition of the up-and-down movement device 220 shown in FIG. 1. As shown in FIG. 5, the up-and-down movement device 220 includes a rack member 221, a gear 222, a shaft member 223, a motor 224, and a control unit 225.

The rack member 221 has a generally triangular cross-section and is fixed to the outer peripheral surface 51A of the cylindrical member 51. The gear 222 is fixed to one end of the shaft member 223 and is engaged with the rack member 221. The shaft member 223 is connected at its one end with the gear 222, and the other end of the shaft member 223 is connected with the shaft (not shown) of the motor 224.

The motor 224 rotates the gear 222 in the direction indicated by the arrow 226 or 227 in accordance with a control signal from the control unit 225. The control unit 225 controls the motor 224 based on the vibration detection signal BDS from the vibration detecting device 240 to rotate the gear 222 in the direction indicated by the arrow 226 or 227.

The supporting device 50 is moved upward in the gravity direction DR1 when the gear 222 rotates in the direction indicated by the arrow 226 in FIG. 5, and when the gear 222 rotates in the direction indicated by the arrow 227 in FIG. 5, the supporting device 50 is moved downward in the gravity direction DR1. Therefore, the clockwise or counter-clockwise rotation of the gear 222 in the direction indicated by the arrow 226 or 227 is equivalent to the upward or downward movement of the supporting device 50 in the gravity direction DR1. The length of the rack member 221 in the gravity direction DR1 is equivalent to the distance by which the seed crystal 5 is raised or lowered by the supporting device 50.

Figure 6:
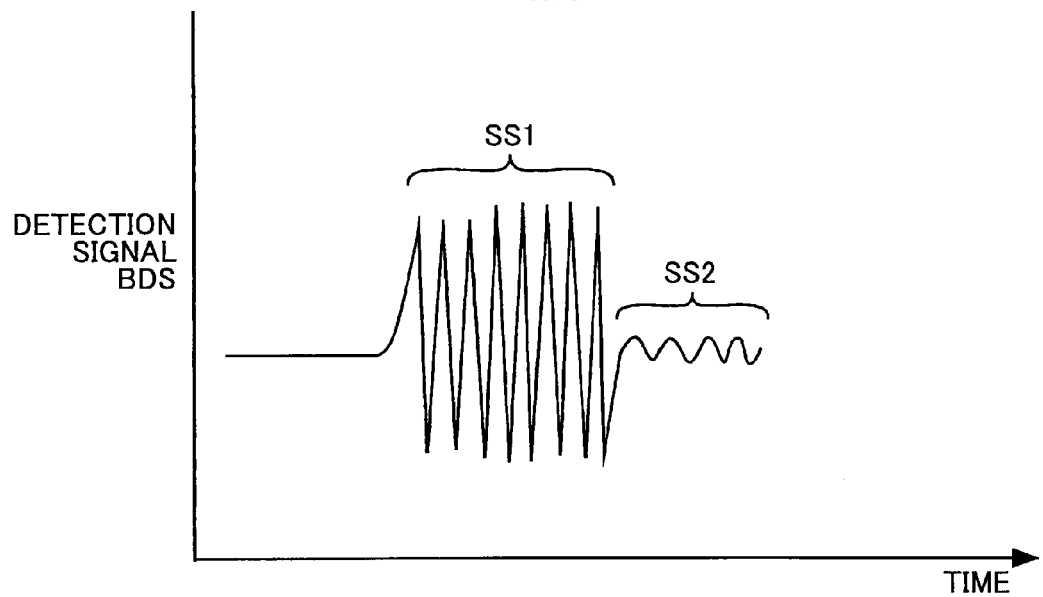
FIG. 6 is a timing chart of a vibration detection signal.

FIG. 6 is a timing chart of the vibration detection signal BDS. As shown in FIG. 6, the vibration detection signal BDS detected by the vibration detecting device 240 includes a signal component SS1 when the seed crystal 5 is not in contact with the mixed molten metal 290. On the other hand, when the seed crystal 5 is in contact with the mixed molten metal 290, the vibration detection signal BDS includes a signal component SS2.

The seed crystal 5 vibrates greatly by the vibrations applied by the vibration applying device 230 when the seed crystal 5 is not in contact with the mixed molten metal 290, and the vibration detection signal BDS in this case includes the signal component SS1 having a comparatively large amplitude.

On the other hand, the seed crystal 5 does not vibrate greatly due to the viscosity of the mixed molten metal 290 even if vibrations are applied thereto by the vibration applying device 230 when the seed crystal 5 is in contact with the mixed molten metal 290, and the signal detection signal BDS in this case includes the signal component SS2 having a comparatively small amplitude.

Referring back to FIG. 5, when the vibration detection signal BDS is received from the vibration detecting device 240, the control unit 225 detects the signal component of the received vibration detection signal BDS. When the detected signal component includes the signal component SS1, the control unit 225 controls rotation of the motor 224 so that the supporting device 50 is lowered in the gravity direction DR1, until the detected signal component of the vibration detection signal BDS is changed to the signal component SS2.

Specifically, the control unit 225 controls the motor 224 to rotate the gear 222 in the direction indicated by the arrow 227, and the motor 224 rotates the gear 222 in the direction of arrow 227 through the shaft member 223 according to the control from the control unit 225. In this manner, the supporting device 50 is moved downward in the gravity direction DR1.

If the signal component of the vibration detection signal BDS received from the vibration detecting device 240 is changed from the signal component SS1 to the signal component SS2, the control unit 225 controls the motor 224 to suspend rotation of the gear 222, and the motor 224 stops rotation of the gear 222 according to the control from the control unit 225. In this manner, the supporting device 50 suspends movement and holds the seed crystal 5 to the gas-liquid interface 3.

On the other hand, when the vibration detection signal BDS including the signal component SS2 is received from the vibration detecting device 240, the control unit 225 controls the motor 224 to suspend movement of the supporting device 50. Thus, based on the vibration detection signal BDS detected by the vibration detecting device 240, the up-and-down movement device 220 moves up or down the supporting device 50 in the gravity direction DR1 so that the seed crystal 5 may touch the mixed molten metal 290.

Figure 7:
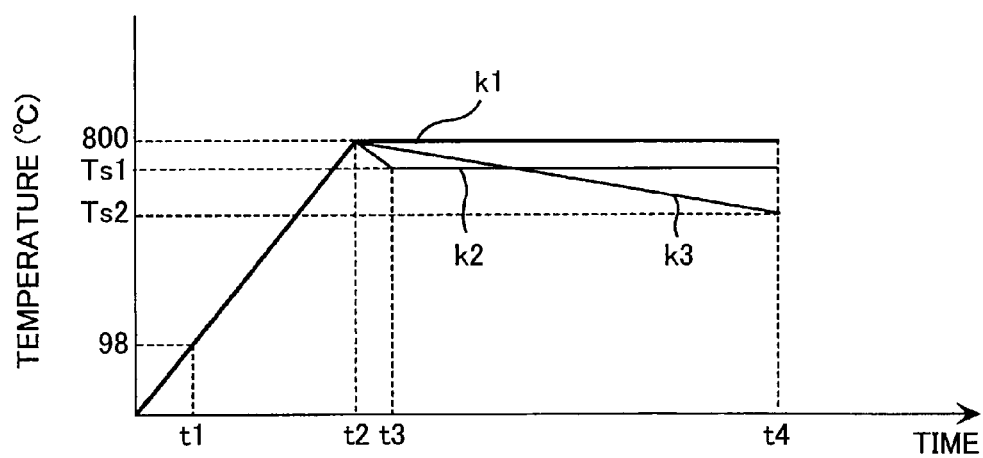
FIG. 7 is a timing chart of the temperature of a crucible and a reaction container.
Figure 8A:
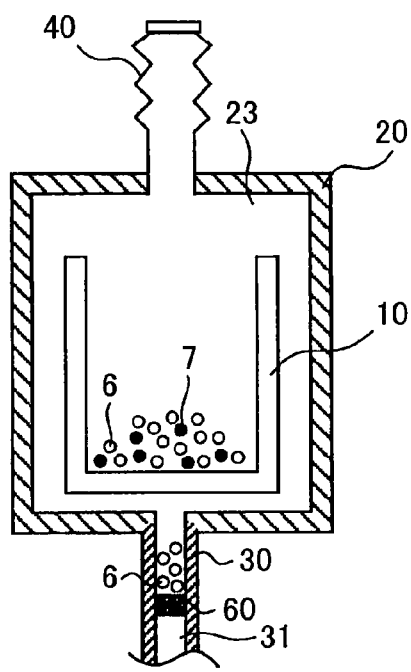
FIG. 8A and FIG. 8B are diagrams showing the change of state in the crucible and the reaction container before and after timing t1 shown in FIG. 7.
Figure 8B:
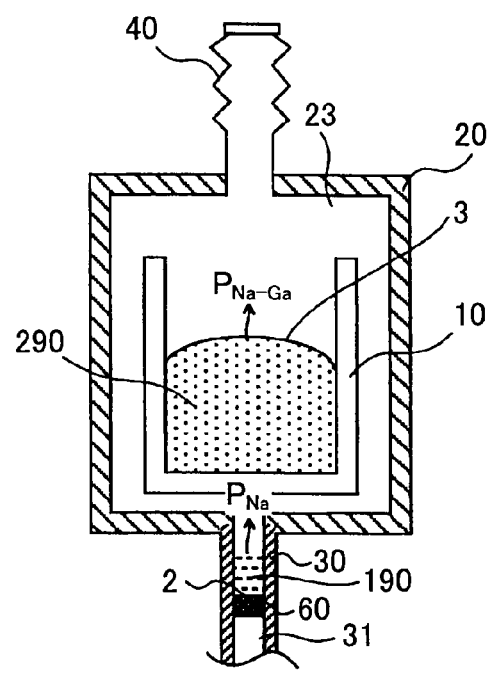
Figure 9:
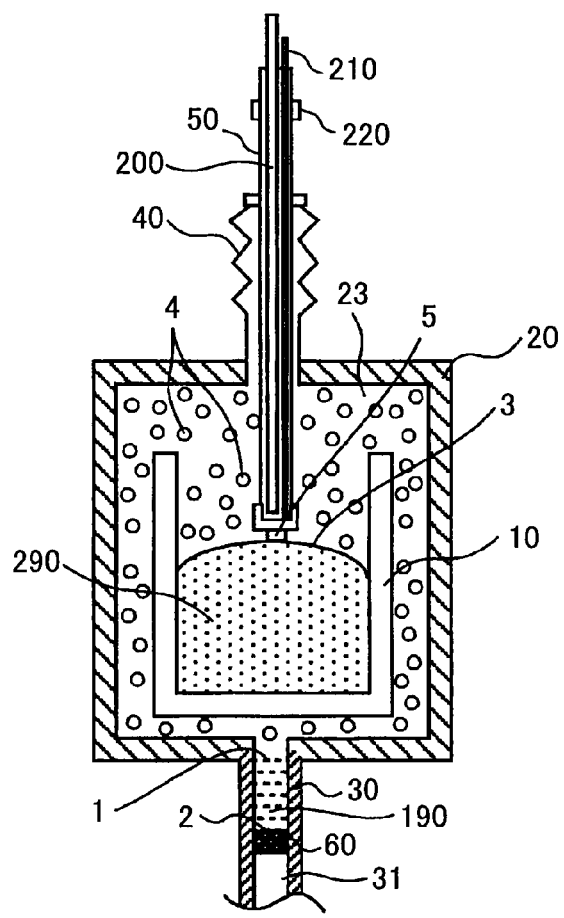
FIG. 9 is a diagram showing the state in the crucible and the reaction container between timing t1 and timing t2 shown in FIG. 7.
Figure 10:
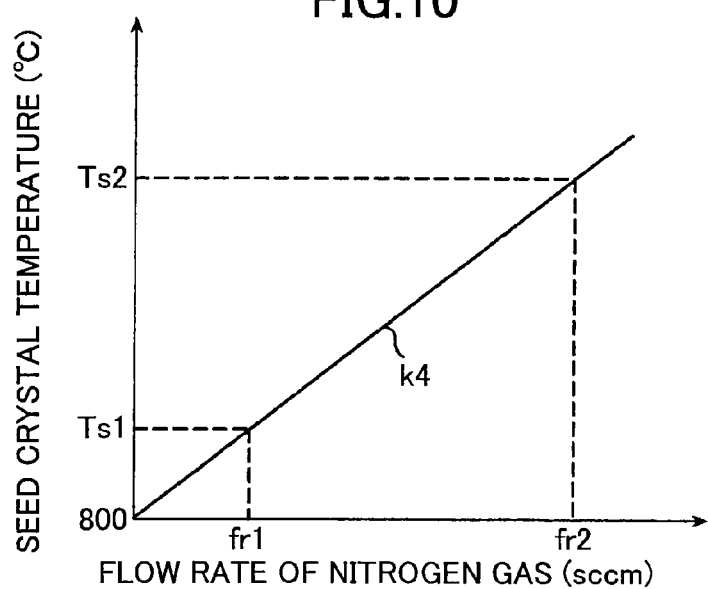
FIG. 10 is a diagram showing the relation between the temperature of seed crystal and the flow rate of nitrogen gas.

FIG. 7 is a timing chart of the temperature of the crucible 10 and the reaction container 20. FIG. 8A and FIG. 8B are diagrams showing the change of state in the crucible 10 and the reaction container 20 before and after timing t1 shown in FIG. 7. FIG. 9 is a diagram showing the state in the crucible 10 and the reaction container 20 between timing t1 and timing t2 shown in FIG. 7. FIG. 10 is a diagram showing the relation between the temperature of seed crystal 5 and the flow rate of nitrogen gas.

In FIG. 7, the straight line k1 indicates the temperature of the crucible 10 and the reaction container 20, and the curve k2 and the straight line k3 indicate the temperature of the seed crystal 5.

As shown in FIG. 7, the heating devices 70 and 80 heat the crucible 10 and the reaction container 20 so that the temperature rises according to the straight line k1 and is held at 800 degrees C.

When the heating devices 70 and 80 start heating the crucible 10 and the reaction container 20, metal Na 6 exists in the piping 30 and metal Na 6 and metal Ga 7 exist in the crucible 10 (see FIG. 8A).

When the temperature of the crucible 10 and the reaction container 20 rises to 98 degrees C. in timing t1, metal Na in the crucible 10 is melted and mixed with metal Ga which is already been melted at about 30 degrees C. As a result, the mixed molten metal 290 is produced in the crucible 10.

Then, the temperature of the crucible 10 and reaction container 20 rises to 800 degrees C. in timing t2. In the process in which the temperature of the crucible 10 and the reaction container 20 rises to 800 degrees C., the temperature of the piping 30 above the molten metal holding member 60 rises to 98 degrees C. or higher. At such temperature, metal Na 6 held in the piping 30 is melted and the molten metal 190 is produced in the piping 30. And the molten metal holding member 60 holds the molten metal 190 by the surface tension of the molten metal 190.

In this case, the heating devices 80 raise the temperature of the portion of the piping 30 which touches the molten metal 190 to a specific temperature at which the vapor pressure PNa of metal Na which evaporates from the molten metal 190 is substantially balanced with the vapor pressure PNa-Ga of metal Na which evaporates from the mixed molten metal 290. Namely, the temperature of the portion of the piping 30 which touches the molten metal 190 is raised to the specific temperature at which evaporation of metal Na from the molten metal 190 and evaporation of metal Na from the mixed molten metal 290 become equilibrium by the heating device 80 (see FIG. 8B).

Accordingly, movement of metal Na from the molten metal 190 to the mixed molten metal 290 and movement of metal Na from the mixed molten metal 290 to the molten metal 190 become equilibrium, and movement of metal Na is seemingly suspended between the molten metal 190 and the mixed molten metal 290. As a result, it is possible to prevent changing of the mixing ratio of metal Na and metal Ga in the mixed molten metal 290 due to the evaporation of metal Na from the molten metal 190 and the mixed molten metal 290. If the temperature of the molten metal holding member 60 at this time is above the melting point of metal Na and substantial evaporation of Na does not occur a this temperature, diffusion of metal Na to the space 31 of the piping 30 can be disregarded, and it is possible to prevent changing of the mixing ratio of metal Na and metal Ga in the mixed molten metal 290. The temperature at which substantial evaporation of Na does not occur is, for example, a temperature in a range of 200-300 degrees C. The vapor pressure of Na at 200 degrees C. is about $1.8 \times 10^{-2}$ Pa, and the vapor pressure of Na at 300 degrees C. is about 1.8 Pa. When the specific temperature is beyond the above-mentioned range, there is diffusion by some evaporation but it is possible to prevent changing of the mixing ratio of metal Na and metal Ga in the mixed molten metal 290.

When the temperature of the crucible 10 and the reaction container 20 rises to 98 degrees C. in timing t1 and rises to 800 degrees C. to timing t2, the nitrogen gas 4 in the space 23 cannot be spread into the space 31 of the piping 30 through the molten metal 190 (=molten metal Na) and the molten metal holding member 60, but it is enclosed in the space 23 (see FIG. 9).

In timing t2 when the temperature of the crucible 10 and the reaction container 20 rises to 800 degrees C., the up-and-down movement device 220 moves up or down the supporting device 50 based on the vibration detection signal BDS from the vibration detecting device 240, so that the seed crystal 5 is brought in contact with the mixed molten metal 290.

In the high temperature state in which the temperature of the crucible 10 and the reaction container 20 is about 800 degrees C., the nitrogen gas 4 in the space 23 is captured into the mixed molten metal 290 through the metal Na. In this case, the concentration of nitrogen or the concentration of $Ga_xN_y$ (where x and y are real numbers) in the mixed molten metal 290 near the gas-liquid interface 3 of the space 23 and the mixed molten metal 290 is the highest, and crystal growth begins from the seed crystal 5 where the GaN crystal touches the gas-liquid interface 3.

In this invention, $Ga_xN_y$ is called "group III nitride" and concentration of $Ga_xN_y$ is called "group III nitride concentration".

When nitrogen gas is not supplied to the piping 200, the temperature T3 of seed crystal 5 is the same as the temperature (800 degrees C.) of the mixed molten metal 290. However, in this invention, in order to raise the degree of supersaturation of nitrogen or a group III nitride in the mixed molten metal 290 in the neighborhood of the seed crystal 5, nitrogen gas is supplied to the piping 200 so that the seed crystal 5 is cooled, and the temperature T3 of the seed crystal 5 is made lower than the temperature of the mixed molten metal 290.

More specifically, after timing t2, the temperature T3 of seed crystal 5 is set to the temperature Ts1 (which is lower than 800 degrees C.) according to the curve k2. This temperature Ts1 is equal to 790 degrees C., for example.

The method which sets the temperature T3 of the seed crystal 5 to the temperature Ts1 will be explained. When the temperatures T1 and T2 received from temperature sensors 71 and 81 reach (800+alpha)° C. (=temperature of the heaters contained in the heating devices 70 and 80 when setting the crucible 10 and the reaction container 20 to 800 degrees C.), the temperature control device 280 generates a control signal CTL3 for pouring the nitrogen gas at a flow rate which sets the temperature T3 of the seed crystal 5 to the temperature Ts1 and outputs the control signal CTL3 to the flowmeter 260.

In response to the control signal CTL3, the flowmeter 260 pours the nitrogen gas from the gas cylinder 270 into the piping 200 through the gas supply line 250 at the flow rate which sets the temperature T3 to the temperature Ts1.

The temperature of the seed crystal 5 falls from 800 degrees C. proportionally in accordance with the flow rate of the nitrogen gas. When the flow rate of the nitrogen gas is set to the flow rate fr1 (sccm), the temperature T3 of the seed crystal 5 is set to the temperature Ts1 (see FIG. 10). Therefore, the flowmeter 260 pours the nitrogen gas into the piping 200 at the flow rate fr1.

The nitrogen gas supplied to the piping 200 is sprayed to the bottom 51B of the cylindrical member 51 through the small holes 201 of the piping 200. The seed crystal 5 is cooled through the bottom 51B of the cylindrical member 51, and the temperature T3 of the seed crystal 5 falls to the temperature Ts1 in timing t3, and it is held at this temperature Ts1 up to timing t4.

There is a predetermined difference of temperature alpha between the temperatures T1 and T2 of the heaters of the heating devices 70 and 80 and the temperature of the mixed molten metal 290. And the temperature control device 280 controls, when the temperature T3 of the seed crystal 5 begins to fall from 800 degrees C., the heating devices 70 and 80 by outputting the control signals CTL1 and CTL2, so that the temperatures T1 and T2 received from the temperature sensors 71 and 81 are set to (800+alpha)° C.

In this invention, the temperature T3 of the seed crystal 5 is preferably controlled to fall according to the straight line k3 after timing t2. That is, the temperature T3 of the seed crystal 5 falls from 800 degrees C. to the temperature Ts2 (<Ts1) during the period between timing t2 and timing t4. In this case, the flowmeter 260 increases the flow rate of the nitrogen gas poured into the piping 200 from 0 to the flow rate fr2 (>fr1) according to the straight line k4 based on the control signal CTL3 from the temperature control device 280.

If the flow rate of nitrogen gas is set to the flow rate fr2, the temperature T3 of the seed crystal 5 is set to the temperature Ts2 (which is lower than the temperature Ts1). This temperature Ts2 is 750 degrees C., for example.

In this manner, by increasing gradually the difference between the temperature (=800 degrees C.) of the mixed molten metal 290 and the temperature T3 of the seed crystal 5, the degree of supersaturation of nitrogen or a group III nitride in the mixed molten metal 290 in the neighborhood of the seed crystal 5 becomes large gradually, and the crystal growth of a GaN crystal can be continued.

In performing crystal growth of a GaN crystal using the crystal preparing device 100, the seed crystal 5 is replaced by a GaN crystal which grows up in the crystal preparing device 100 without using the seed crystal 5.

Figure 11:
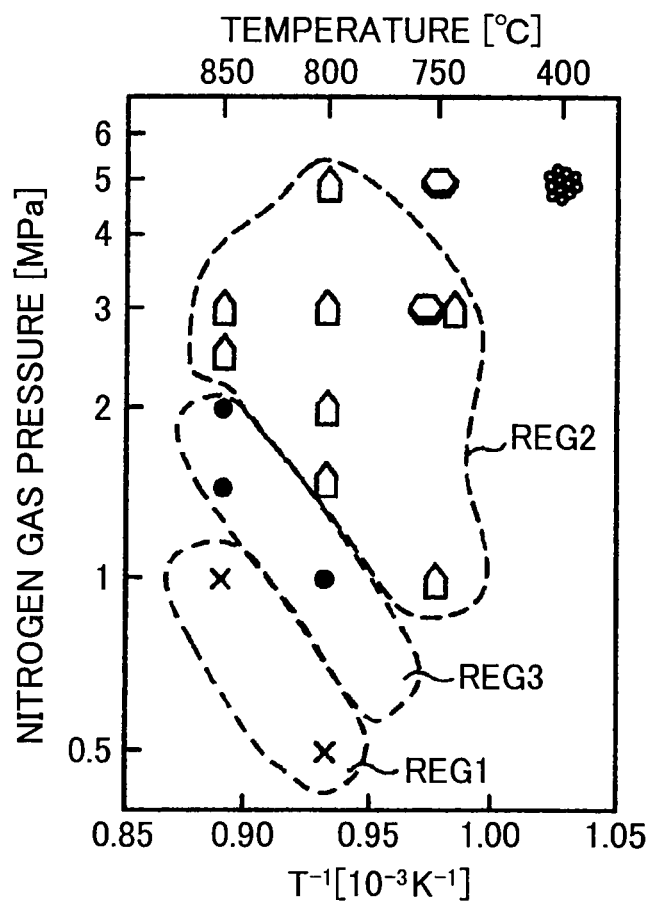
FIG. 11 is a diagram showing the relation between the nitrogen gas pressure and the crystal growth temperature in the case of growing up a GaN crystal.

FIG. 11 is a diagram showing the relation between the nitrogen gas pressure and the crystal growth temperature in the case of growing up a GaN crystal.

In FIG. 11, the horizontal axis expresses the crystal growth temperature and the vertical axis expresses the nitrogen gas pressure. In FIG. 11, the range REG2 is a range in which many nuclei occur in the bottom and the side of the crucible 10 which touch the mixed molten metal 290 and a GaN crystal in the pillar-like form growing up in the direction of c axis (<0001>) is produced.

When producing seed crystal 5, a GaN crystal is grown up using the nitrogen gas pressure and the crystal growth temperature which are located in the range REG2. In this case, many nuclei occur on the bottom and the side wall in the crucible 10, and a pillar-shaped GaN crystal which is grown up in the direction of c axis is produced.

One GaN crystal is selected from among many GaN crystals produced through crystal growth, and the selected GaN crystal is cut into the shape shown in FIG. 4A so that the seed crystal 5 is produced. Therefore, the projection part 5A (see FIG. 4B) of the seed crystal 5 includes the GaN crystal which is grown up in the direction of c axis (<0001>).

By the above-mentioned method, the produced seed crystal 5 is fitted into the space 54 of the supporting device 50, and it is fixed to the supporting device 50.

FIG. 12 is a flowchart for explaining the crystal preparing method of a GaN crystal.

Upon start of the crystal preparing method of FIG. 12, the crucible 10, the reaction container 20, and the piping 30 are put in into the glove box which is filled up with Ar gas.

Metal Na is put into the piping 30 in the Ar gas atmosphere (step S1). The moisture content of the Ar gas in this case is 1 ppm or less, and the concentration of oxygen in the AR gas is 1 ppm or less.

Then, metal Na and metal Ga are put into the crucible 10 in the Ar gas atmosphere (step S2). In this case, metal Na and metal Ga are put into the crucible 10 at the mixing ratio of 5:5. The crucible 10 containing metal Na and metal Ga is placed in the reaction container 20.

Then, the seed crystal 5 is placed on top of the metal Na and metal Ga in the crucible 10 in the Ar gas atmosphere (step S3).

More specifically, the seed crystal 5 is placed on top of the metal Na and metal Ga in the crucible 10, by fitting the seed crystal 5 into the space 54 formed at the end 511 of the supporting device 50 (see FIG. 4B).

Then, the crucible 10 and the reaction container 20 are taken out from the glove box 300, and the crucible 10 and the reaction container 20 are set to the crystal preparing device 100 in the state where the inside of the crucible 10 and the reaction container 20 is filled up with the Ar gas.

The valve 160 is opened, and the Ar gas which is filled in the crucible 10 and the reaction container 20 is exhausted using the vacuum pump 170.

After vacuum suction of the inside of the crucible 10 and the reaction container 20 to a predetermined pressure (0.133 Pa or less) is performed using the vacuum pump 170, the valve 160 is closed and the valves 120,121 are opened so that the inside of the crucible 10 and the reaction container 20 is filled up with the nitrogen gas fed from the gas cylinder 140 through the gas supply lines 90,110.

In this case, the nitrogen gas is supplied to the crucible 10 and the reaction container 20 so that the pressure in the crucible 10 and the reaction container 20 is set to about 0.1 MPa using the pressure regulator 130.

When the pressure in the reaction container 20 detected by the pressure sensor 180 is set to about 0.1 MPa, the valves 120,121 are closed and the valve 160 is opened so that the nitrogen gas which is filled in the crucible 10 and the reaction container 20 is exhausted using the vacuum pump 170. Also in this case, the vacuum suction of the inside of the crucible 10 and the reaction container 20 to the predetermined pressure (0.133 Pa or less) is performed using the vacuum pump 170.

The supply of nitrogen gas to the crucible 10 and the reaction container 20 and the vacuum suction of the reaction container 20 and the crucible 10 are repeatedly performed several times.

Then, after the out vacuum suction of the inside of the crucible 10 and the reaction container 20 to the predetermined pressure is performed using the vacuum pump 170, the valve 160 is closed the valves 120,121 are opened so that the nitrogen gas is supplied to the crucible 10 and the reaction container 20 and the pressure in the crucible 10 and the reaction container 20 is set to the range of 1.01-5.05 MPa using the pressure regulator 130 (step S4).

In this case, the metal Na in the piping 30 is solid, the nitrogen gas is supplied from the space 31 of the piping 30 to the space 23 of the reaction container 20 through the molten metal holding member 60. Then, the valve 120 is closed when the pressure in the space 23 detected by the pressure sensor 180 is set to the range of 1.01-5.05 MPa.

Then, the crucible 10 and the reaction container 20 are heated to 800 degrees C. using the heating devices 70 and 80 (step S5). The molten metal 190 is heated to the specific temperature at which the vapor pressure PNa of metal Na which evaporates from the molten metal 190 is substantially balanced with the vapor pressure PNa-Ga of metal Na which evaporates from the mixed molten metal 290 (step S6).

In this case, since the melting point of metal Na held in the piping 30 is about 98 degrees C., the metal Na is melt in the process in which the crucible 10 and the reaction container 20 are heated to 800 degrees C., and it becomes the molten metal 190. The two gas-liquid interfaces 1 and 2 occur (see FIG. 1). The gas-liquid interface 1 is located at the interface of the molten metal 190 and the space in the reaction container 20, and the gas-liquid interface 2 is located at the interface of the molten metal 190 and the molten metal holding member 60.

In the process in which the crucible 10 and the reaction container 20 are heated to 800 degrees C., the metal Na and metal Ga in the crucible 10 are also liquefied, and the mixed molten metal 290 of metal Na and metal Ga is generated in the crucible 10. The vapor pressure PNa is substantially equal to the vapor pressure PNa-Ga.

Then, the up-and-down movement device 220 moves up or down the seed crystal 5 so that the seed crystal 5 contacts the mixed molten metal 290 by the above-mentioned method (step S7).

In the high temperature state (the temperature of the crucible 10 and the reaction container 20 is about 800 degrees C.), the nitrogen gas in the space 23 is captured into the mixed molten metal 290 through the metal Na, a GaN crystal begins to grow up from the seed crystal 5.

The temperature of the crucible 10 and the reaction container 20 and the nitrogen gas pressure in the reaction container 20 at this time are located in the range REG3 shown in FIG. 11. This range REG3 is a range in which crystal growth of a GaN crystal tends to occur preferentially over the seed crystal.

Then, the temperature of the crucible 10 and the reaction container 20 is held at 800 degrees C. for a predetermined time (in a range of tens of hours to hundreds of hours) (step S8). And the temperature T3 of the seed crystal 5 is set to the temperature Ts1 or Ts2 which is lower than the temperature (=800 degrees C.) of the mixed molten metal 290 by the above-mentioned method (step S9).

With advance of the GaN crystal growth, the nitrogen gas in the space 23 is consumed and the nitrogen gas in the space 23 is decreased. Then, the pressure P1 in the space 23 becomes lower than the pressure P2 in the space 31 (P1<P2), a differential pressure occurs between the space 23 and the space 31, and the nitrogen gas in the space 31 is supplied gradually to the space 23 through the molten metal holding member 60 and the molten metal 190 (=molten metal Na).

That is, nitrogen gas is supplied to the space 23 of the crucible 10 and the reaction container 20 (step S10). Then, the seed crystal 5 is moved up or down by the above-mentioned method so that the seed crystal 5 contacts the mixed molten metal 290 (step S11). A GaN crystal having a large size will be produced.

After the predetermined time passes, the temperature of the crucible 10 and the reaction container 20 is lowered (step S12). The preparation of a GaN crystal is completed.

As mentioned above, in this embodiment, the vapor pressure PNa-Ga of metal Na which evaporates from the mixed molten metal 290 is substantially balanced with the vapor pressure PNa of metal Na which evaporates from the molten metal 190, and the GaN crystal is produced through crystal growth.

Therefore, movement of metal Na between the molten metal 190 and the mixed molten metal 290 does not occur, seemingly, and change of the mixing ratio of metal Na and metal Ga in the mixed molten metal 290 can be prevented.

As a result, the mixing ratio of metal Na and metal Ga can be held at a controlled ratio, and the GaN crystal is produced through crystal growth.

Although the bottom 20B of the reaction container 20 is heated by the heating device 80, in step S1 of the flowchart of FIG. 12, the amount of metal Na which is put into the piping 30 is set to an amount in which the molten metal 190 does not enter into the reaction container 20 when the metal Na in the piping 30 becomes the molten metal 190.

When the temperature of the crucible 10 and the reaction container 20 is increased to 800 degrees C., the temperature of the molten metal 190 is lower than that of the mixed molten metal 290, the vapor pressure PNa can be easily balanced with the vapor pressure PNa-Ga. It is possible to stabilize the mixing ratio of metal Na and metal Ga in the mixed molten metal 290 from the start time of crystal growth, and the GaN crystal can be produced.

FIG. 13A and FIG. 13B are diagrams for explaining the amount of metal Na. The case where molten metal 190 teaches metal Na of the amount which exists also in reaction container 20 into piping 30 will be explained.

Suppose that the gas-liquid interface 1A of the molten metal 190 and the space 23 exists in the almost same position as the gas-liquid interface 3 of the mixed molten metal 290 and space 23 (see FIG. 13A).

The molten metal 190 is heated by the heating devices 70 and 80 through the reaction container 20, and the temperature of the molten metal 190 is almost equal to the temperature of the mixed molten metal 290. As a result, the vapor pressure PNa of metal Na which evaporates from the molten metal 190 becomes higher than the vapor pressure PNa-Ga of metal Na which evaporates from the mixed molten metal 290.

If the vapor pressure PNa is higher than the vapor pressure PNa-Ga, the metal Na moves from the molten metal 190 to the mixed molten metal 290. When the vapor pressure PNa is substantially equal to the vapor pressure PNa-Ga, movement of metal Na from the molten metal 190 to the mixed molten metal 290 is suspended. That is, when the gas-liquid interface 1A of the molten metal 190 and the space 23 falls to the gas-liquid interface 1B in the piping 30, movement of metal Na from the molten metal 190 to the mixed molten metal 290 is suspended (see FIG. 13B). Movement of metal Na in this case means gaseous phase transportation.

Thus, even when metal Na in the amount to make the molten metal 190 enter the reaction container 20 is set to the piping 30, the metal Na moves from the molten metal 190 to the mixed molten metal 290 so that the vapor pressure PNa of metal Na which evaporates from the molten metal 190 is substantially balanced with the vapor pressure PNa-Ga of metal Na which evaporates from the mixed molten metal 290.

Therefore, in this invention, the step S1 of the flowchart shown in FIG. 12 may be provided so that the metal Na in the amount existing between the crucible 10 and the reaction container 20 and in the piping 30 is supplied to the piping 30. Generally, metal Na in the amount in which the molten metal 190 exists at least in the piping 30 is set to the piping 30.

In this case, crystal growth of a GaN crystal is performed at the mixing ratio of metal Na and metal Ga in the mixed molten metal 290 when the vapor pressure PNa of metal Na which evaporates from the molten metal 190 is substantially equal to the vapor pressure PNa-Ga of metal Na which evaporates from the mixed molten metal 290.

As mentioned above, it is preferred that, when the temperature of the crucible 10 and the reaction container 20 is increased to 800 degrees C., the amount of metal Na when the vapor pressure PNa of metal Na which evaporates from the molten metal 190 is balanced with the vapor pressure PNa-Ga of metal Na which evaporates from the mixed molten metal 290 is entered into the piping 30.

Even when the temperature of the crucible 10 and the reaction container 20 is increased to 800 degrees C. and the gas-liquid interface 1A of the molten metal 190 and the space 23 is in the position that is the same as that of the gas-liquid interface 3 of the mixed molten metal 290 and the space 23 (see FIG. 13A), movement of metal Na from the molten metal 190 to the mixed molten metal 290 occurs. And, finally, the vapor pressure PNa of metal Na which evaporates from the molten metal 190 is substantially balanced with the vapor pressure PNa-Ga of metal Na which evaporates from the mixed molten metal 290.

Conversely, when PNa<PNa-Ga (i.e., when a small mount of metal Na remains), movement of Na vapor from the mixed molten metal 290 to the molten metal 190 arises. And, finally, the vapor pressures PNa and PNa-Ga becomes substantially in agreement.

The crystal preparing method of the invention may be provided so that the metal Na is set in the amount in which the molten metal 190 can exist in the reaction container 20 when the temperature of the crucible 10 and the reaction container 20 is increased to 800 degrees C., and crystal growth of a GaN crystal is performed. Moreover, the crystal preparing method of the invention may be provided so that the metal Na is set in the amount in which the molten metal 190 can exist between the space 23 and the molten metal holding member 60, and crystal growth of a GaN crystal is performed.

This is because the molten metal 190 existing between the space 23 and the molten metal holding member 60 is equivalent to balancing the vapor pressure PNa of metal Na which evaporates from the molten metal 190 with the vapor pressure PNa-Ga of metal Na which evaporates from the mixed molten metal 290.

Therefore, in the crystal preparing device which supplies nitrogen gas through the molten metal 190 to the space 23 which contacts the mixed molten metal 290, and performs crystal growth of a GaN crystal, if the metal Na (solid) exists in the passage for supplying the nitrogen gas to the space 23 after the crystal growth of the GaN crystal is completed, it means performing crystal growth of a GaN crystal using the crystal preparing device of the invention.

If Ga in the mixed molten metal 290 is consumed and the amount of Na contained in the mixed molten metal 290 is increased during the crystal growth, the vapor pressure PNa-Ga is increased. As a result, movement of Na to the molten metal 190 takes place, and the Na vapor pressure is balanced between the mixed molten metal 290 and the molten metal 190 and held at a controlled ratio. Thus, it is possible to perform stable crystal growth of the GaN crystal, and improvement of quality of the GaN crystal and increase of crystal size can be realized.

Figure 14:
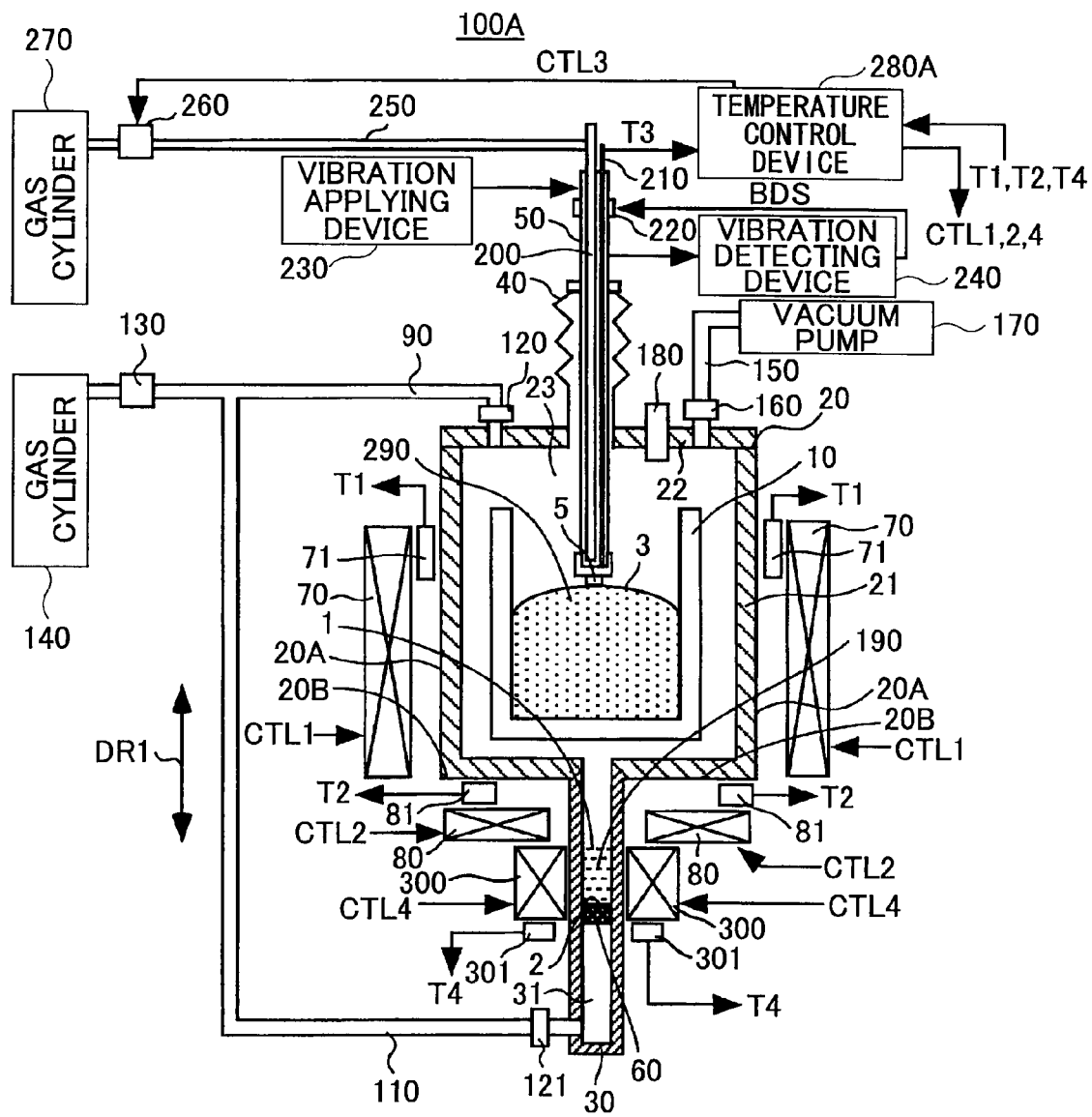
FIG. 14 is a diagram showing the composition of a crystal preparing device in an embodiment of the invention.

FIG. 14 shows the composition of a crystal preparing device 100A in an embodiment of the invention. As shown in FIG. 14, in the crystal preparing device 100A, the temperature control device 280 of the crystal preparing device 100 shown in FIG. 1 is replaced with a temperature control device 280A, and a heater/condenser 300 and a temperature sensor 301 are added. Other composition of this crystal preparing device 100A is the same as that of the crystal preparing device 100.

The heater/condenser 300 is arranged around the portion of the piping 30 where the molten metal holding member 60 is arranged, and it is located above the molten metal holding member 60.

The temperature sensor 301 is arranged near the heater/condenser 300. The temperature control device 280A receives the temperature T4 from the temperature sensor 301.

The temperature control device 280A generates a control signal CTL4 for heating the molten metal 190 to the specific temperature at which the vapor pressure PNa of metal Na which evaporates from the molten metal 190 is substantially equal to the vapor pressure PNa-Ga of metal Na which evaporates from the mixed molten metal 290, based on the received temperature T4. The generated control signal CTL4 is outputted to the heater/condenser 300. In addition, the temperature control device 280A performs the same function as the temperature control device 280.

In response to the control signal CTL4 from the temperature control device 280A, the heater/condenser 300 heats or cools the molten metal 190 to the specific temperature.

Namely, when the temperature of the molten metal 190 is lower than the specific temperature, the heater/condenser 300 heats the molten metal 190 so that the temperature of the molten metal 190 is increased to the specific temperature. On the other hand, when the temperature of the molten metal 190 is higher than the specific temperature, the heater/condenser 300 cools the molten metal 190 so that the temperature of the molten metal 190 is decreased to the specific temperature.

The temperature sensor 301 detects the temperature T4 of the heater/condenser 300, and outputs the detected temperature T4 to the temperature control device 280A.

In the crystal preparing device 100A, the amount of metal Na set in the piping 30 is controlled so that the position of the gas-liquid interface 1 between the molten metal 190 and the space 23 is set in a position lower than the heating device 80.

Figure 15:
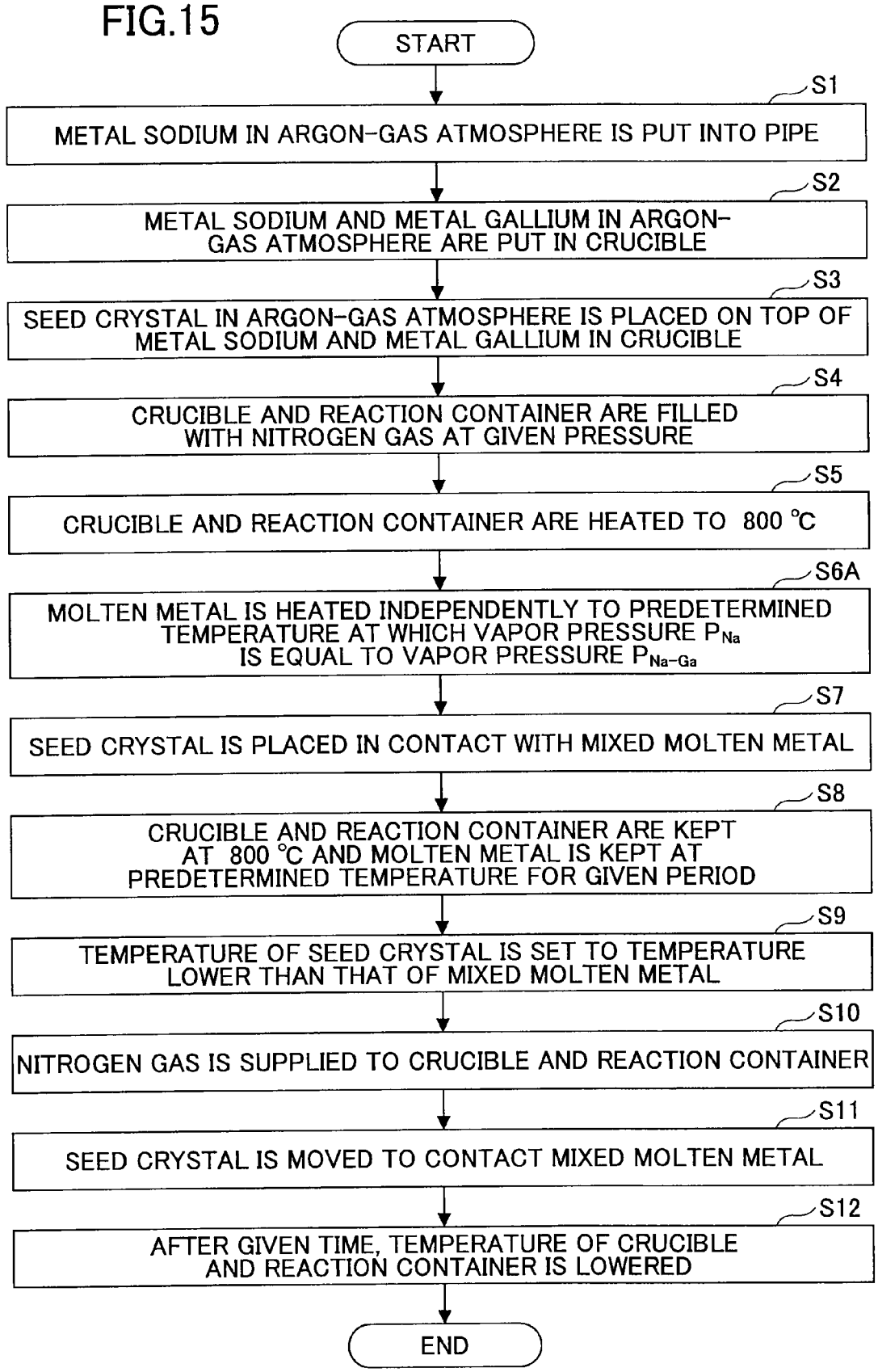
FIG. 15 is a flowchart for explaining the crystal preparing method of a GaN crystal.

In the crystal preparing device 100A, a GaN crystal is produced according to the flowchart shown in FIG. 15. FIG. 15 is a flowchart for explaining the crystal preparing method of a GaN crystal in an embodiment of the invention.

In the flowchart shown in FIG. 15, step S6 in the flowchart shown in FIG. 12 is replaced with step S6A, and other steps in the flowchart shown in FIG. 15 are the same as in the flowchart shown in FIG. 12.

In the above-mentioned step S5, when the crucible 10 and the reaction container 20 are heated to 800 degrees C. using the heating devices 70 and 80, the temperature of the molten metal 190 is independently controlled by the heater/condenser 300 to the specific temperature such that the vapor pressure PNa of metal Na which evaporates from the molten metal 190 is substantially balanced with the vapor pressure PNa-Ga of metal Na which evaporates from the mixed molten metal 290 (step S6A).

Then, the procedure of steps S7-S12 mentioned above is sequentially performed, and the crystal preparing method is completed.

By controlling the temperature of the molten metal 190 independently of the temperature (=the temperature of the crucible 10 and the reaction container 20) of the mixed molten metal 290 as mentioned above, it is possible to easily make the vapor pressure PNa-Ga of metal Na which evaporates from the mixed molten metal 290 equal to the vapor pressure PNa of metal Na which evaporates from the molten metal 190.

The gas cylinder 140, the pressure regulator 130, the gas supply lines 90,110, the valve 121, the piping 30, the molten metal holding member 60, and the molten metal 190 constitute a gas supply device.

Figure 16:
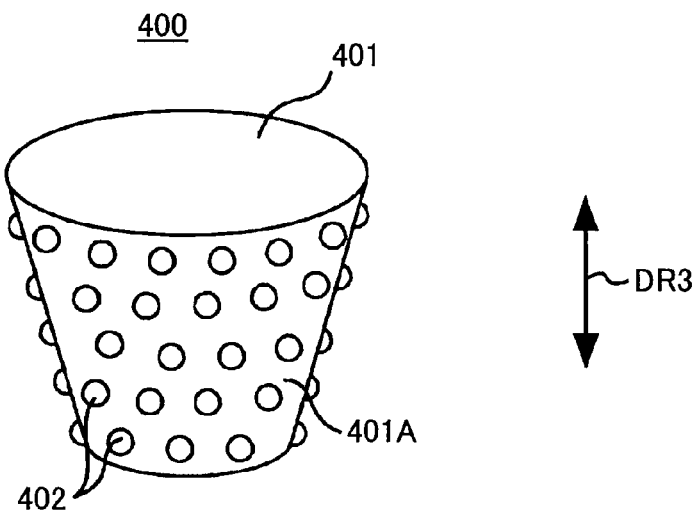
FIG. 16 is a diagram showing an example of the molten metal holding member.
Figure 17:
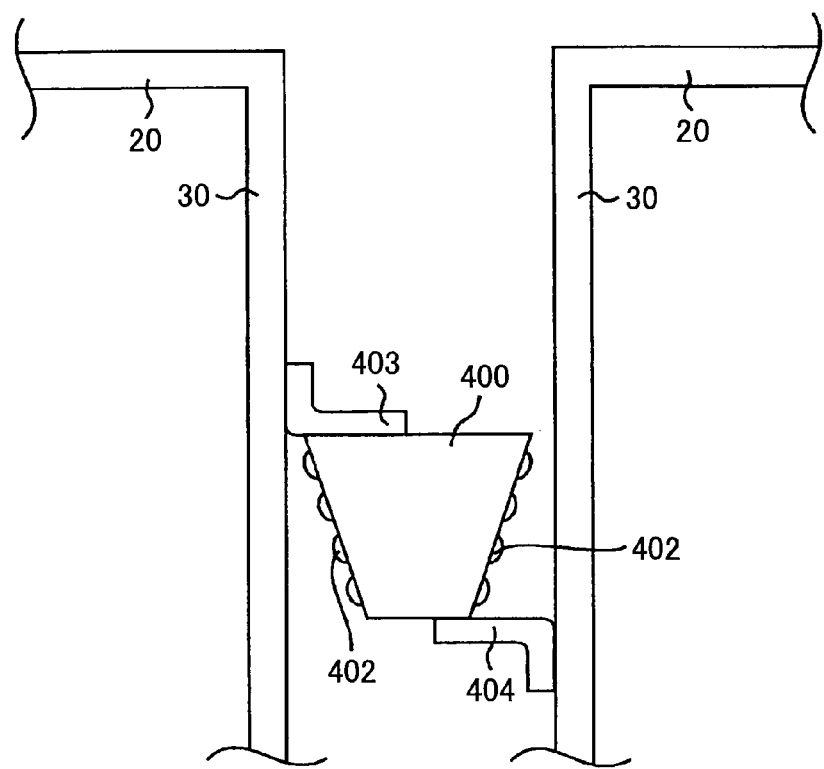
FIG. 17 is a diagram for explaining the fixing method of the molten metal holding member shown in FIG. 16.

FIG. 16 is a diagram showing an example of the molten metal holding member 60. FIG. 17 is a diagram for explaining the fixing method of the molten metal holding member 400 shown in FIG. 16. As shown in FIG. 16, the molten metal holding member 400 includes a plug 401 and a number of projections 402.

The plug 401 has a generally cylindrical shape, and the diameter of the plug 401 changes in the longitudinal direction DR3. Each of the projections 402 has a semi-spherical cross-section, and the diameter thereof is on the order of tens of micrometers. The projections 402 are formed on the outer peripheral surface 401A of the plug 401 at random.

However, the interval between two adjoining projections 402 is set to the order of tens of micrometers.

As shown in FIG. 17, the molten metal holding member 400 is fixed by the supporting members 403,404 in the piping 30.

More specifically, the molten metal holding member 400 is fixed, when the supporting member 403 fixed to the inner wall of piping 30 and the supporting member 404 by which the end is fixed to the inner wall of piping 30 on the other hand face across an end on the other hand.

In this case, the projections 402 of the molten metal holding member 400 may be in contact with the piping 30, and does not need to touch. When the molten metal holding member 400 is fixed so that the projections 402 may not touch the piping 30, the interval of the projections 402 and the piping 30 is set to the interval which can hold the molten metal 190 by the surface tension of the molten metal 190, and the molten metal holding member 400 is fixed by the supporting members 403,404.

Since metal Na into which it is put in piping 30 is a solid before heating of the crucible 10 and the reaction container 20 is started, the nitrogen gas supplied from gas cylinder 140 can diffuse between space 23 in reaction container 20, and piping 30 through the molten metal holding member 400.

When heating of the crucible 10 and the reaction container 20 is started and the temperature of the piping 30 is increased to 98 degrees C. or more, the metal Na in the piping 30 is melt, and it becomes the molten metal 190, which is confined in the nitrogen gas in the space 23.

The molten metal 190 flows into space 31, and bends, and the molten metal holding member 400 holds molten metal 190 with the surface tension of molten metal 190 like.

The molten metal 190 and the molten metal holding member 400 will confine in space 23 nitrogen gas and the metal Na vapor which evaporated from molten metal 190 and the mixed molten metal 290, if GaN crystal growth advances.

As a result, the further evaporation of metal Na from the mixed molten metal 290 can be controlled, and change of the quantitative ratio of metal Na and metal Ga by evaporation of the metal Na in the mixed molten metal 290 can be controlled.

If GaN crystal growth follows on going on and the nitrogen gas in space 23 decreases in number, pressure P1 in space 23 becomes lower than pressure P2 of space 31, and the molten metal holding member 400 will pass the nitrogen gas of space 31 in the direction of reaction container 20, and it will supply it to space 23 through the molten metal 190.

Thus, the molten metal holding member 400 acts like the molten metal holding member 60 mentioned above. Therefore, the molten metal holding member 400 is replaced with the molten metal holding member 60, and is used for crystal preparing device 100.

In the above-mentioned embodiment, the molten metal holding member 400 includes the projections 402, the molten metal holding member 400 does not need to have the projections 402. In this case, the molten metal holding member 400 is fixed to the inner wall of the piping 30 by the supporting members 403,404 so that the interval between the plug 401 and the reaction container 20 and the piping 30 may be set to tens of micrometers.

The molten metal holding member 400 (the case where it does not have a case where it has the projections 402, and the projections 402 are included), the interval of being the same and piping 30 may be made to be determined according to the temperature of the molten metal holding member 400.

In this case, when the temperature of the molten metal holding member 400 is relatively high, the interval of the molten metal holding member 400 and the piping 30 is set up small relatively.

When the temperature of the molten metal holding member 400 is relatively low, the interval of the molten metal holding member 400 and piping 30 is set up greatly relatively.

The interval of the molten metal holding member 400 and piping 30 which can hold molten metal 190 changes with the temperature of the molten metal holding member 400 with surface tension. Therefore, the interval of the molten metal holding member 400 and piping 30 is changed according to the temperature of the molten metal holding member 400, and it enables it to hold molten metal 190 certainly by the surface tension.

Temperature control of the molten metal holding member 400 is performed by the heating device 80. That is, in carrying out temperature rising of the temperature of the molten metal holding member 400 to a temperature higher than 150 degrees C., it heats the molten metal holding member 400 with the heating device 80.

When the molten metal holding member 400 is used, the gas cylinder 140, the pressure regulator 130, the gas supply lines 90,110, the valve 121, the piping 30, the molten metal holding member 400, and the molten metal 190 constitute a gas supply device.

Figure 18A:
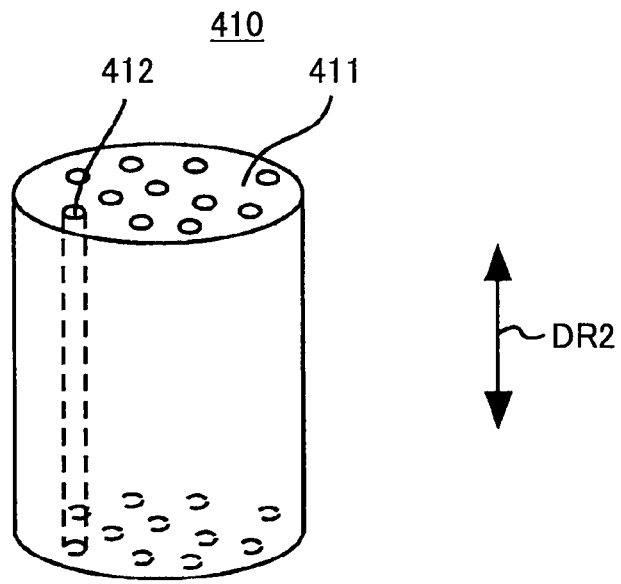
FIG. 18A and FIG. 18B are diagrams showing another example of the molten metal holding member.
Figure 18B:
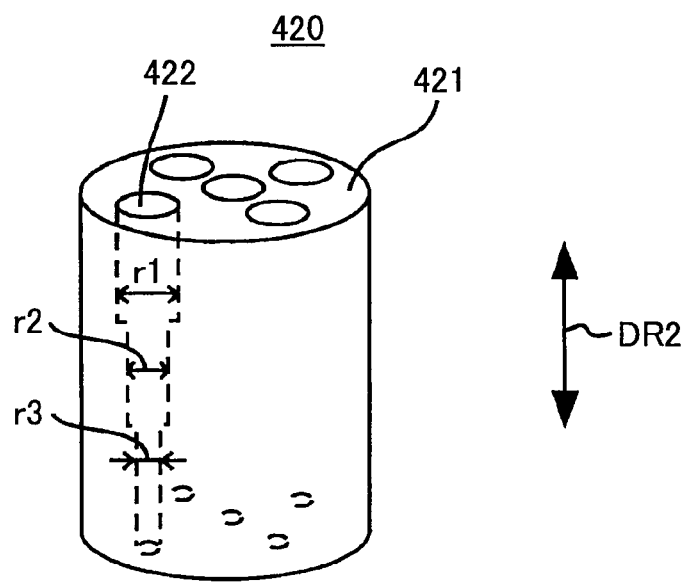

FIG. 18A and FIG. 18B are diagrams showing another example of the molten metal holding member. As shown in FIG. 18A and FIG. 18B, the molten metal holding member 410 includes a plug 411 and a number of penetration holes 412 formed therein. The penetration holes 412 are formed along with the longitudinal direction DR2 of the plug 411. Each of the penetration holes 412 has a diameter of tens of micrometers (see FIG. 18A). In the molten metal holding member 410, at least one penetration hole 412 is formed.

The molten metal holding member 420 includes a plug 421 and a number of penetration holes 422 formed therein. The penetration holes 422 are formed along with the longitudinal direction DR2 of the plug 421. Each of the penetration holes 422 has diameters r1, r2, and r3 which are changed in the longitudinal direction DR2 in two or more steps. Each of the diameters r1, r2, and r3 is determined in the molten metal 190 in the range which can be held by the surface tension. For example, each diameter is determined to be in a range of several micrometers to tens of micrometers (see FIG. 18B).

In the molten metal holding member 420, at least one penetration hole 422 is formed. The diameter of the penetration hole 422 is changed to at least two pieces. The diameter of penetration hole 422 may be changed continuously in the longitudinal direction DR2.

The molten metal holding member 410 or 420 is replaced with and used for the molten metal holding member 60 of crystal preparing device 100.

When the molten metal holding member 420 is replaced with and used for the molten metal holding member 60, it is set to the crystal preparing device 100.

With either of the diameters changed into two or more steps and the molten metal 190 can be held by the surface tension of molten metal 190 even if it does not perform temperature control of the molten metal holding member 420 precisely. Even if it does not perform temperature control of the molten metal holding member 420 precisely, the GaN crystal which has large size can be produced.

When the molten metal holding member 410 or 420 is used, the gas cylinder 140, the pressure regulator 130, the gas supply lines 90,110, the valve 121, the piping 30, the molten metal holding member 410 or 420, and the molten metal 190 constitute a gas supply device.

In this invention, instead of the molten metal holding member 60, a porous plug or a check valve may be used. The porous plug is made of a sintered metal in which stainless powders are sintered, and has the structure where many small holes of tens of micrometers are formed. Therefore, the porous plug can hold the molten metal 190 by the surface tension of the molten metal 190 similar to the molten metal holding member 60 mentioned above. The check valve include both the check valve of spring type used for a low temperature part, and the check valve of piston type used for a high temperature part. In the check valve of piston type, when the pressure P2 in the space 31 is higher than the pressure P1 in the space 23, the piston moves upward along with one pair of guides by the difference of pressure P2 and pressure P1, and the nitrogen gas of the space 31 is supplied to the space 23 through the molten metal 190. And when P1>=P2, the piston moves to close the connection part of the reaction container 20 and the piping 30 by gravity. Therefore, the check valve of piston type can be used in a high temperature part.

In the case of the above embodiment, the crystal growth temperature is 800 degrees C. This invention is not limited to the above embodiment. Alternatively, the crystal growth temperature may be 600 degrees C. or higher. And the nitrogen gas pressure may be a pressure which allows crystal growth using the crystal growth method in the pressurization state of 0.4 MPa or higher. That is, the upper limit of the nitrogen gas pressure may not be limited to 5.05 MPa in the above embodiment. Alternatively, the upper limit of the nitrogen gas pressure may be a pressure of 5.05 MPa or higher.

In the crystal preparing device of this invention, the up-and-down movement device 220, the vibration applying device 230, and the vibration detecting device 240 may be omitted from the crystal preparing device 100. In this case, although the seed crystal 5 is not moved in the up-and-down direction, the seed crystal 5 is supported by the supporting device 50 so that metal Na and metal Ga which is put in the crucible 10 and set in the molten state may contact the mixed molten metal 290. Therefore, a GaN crystal may be produced from the seed crystal 5. As a result, a GaN crystal having a large size can be produced.

In the crystal preparing device of this invention, the thermocouple 210, the piping 200, the gas supply line 250, the flowmeter 260, and the gas cylinder 270 may be omitted from the crystal preparing device 100. In this case, although temperature T3 of seed crystal 5 is not controlled to a temperature lower than the temperature of the mixed molten metal 290 during the crystal growth of a GaN crystal, the seed crystal 5 is contacted by the mixed molten metal 290 using the supporting device 50, a GaN crystal is produced from the seed crystal 5. As a result, a GaN crystal having a large size can be produced.

In the crystal preparing device of this invention, the thermocouple 210, the piping 200, the up-and-down movement device 220, the vibration applying device 230, the vibration detecting device 240, the gas supply line 250, the flowmeter 260, and the gas cylinder 270 may be omitted from the crystal preparing device 100. In this case, although the seed crystal 5 is not moved in the up-and-down direction and the temperature T3 of the seed crystal 5 is not controlled to a temperature lower than the temperature of the mixed molten metal 290, the seed crystal 5 is supported by the supporting device 50 so that metal Na and metal Ga which is put in the crucible 10 and set in the molten state may contact the mixed molten metal 290. Therefore, a GaN crystal is produced from the seed crystal 5. As a result, a GaN crystal having a large size can be produced.

In this invention, by using a crystal preparing device in which the thermocouple 210, the piping 200, the up-and-down movement device 220, the vibration applying device 230, the vibration detecting device 240, the gas supply line 250, flowmeter 260, and the gas cylinder 270 are omitted from the crystal preparing device 100, crystal growth of a GaN crystal may be performed without using the seed crystal 5. In this case, although a GaN crystal grows from the bottom and the side of the crucible 10, the vapor pressure PNa of metal Na which evaporates from the molten metal 190 is substantially balanced with the vapor pressure PNa-Ga of metal Na which evaporates from the mixed molten metal 290, the mixing ratio of metal Na and metal Ga in the mixed molten metal 290 is held at a controlled ratio, and the crystal growth of a GaN crystal can be performed.

In the above embodiment, metal Na and metal Ga are put into the crucible 10 in the Ar gas atmosphere and metal Na is put into the piping 30 in the Ar gas atmosphere. Alternatively, metal Na and metal Ga may be put into the crucible 10 and metal Na may be put into the piping 30 in a nitrogen gas atmosphere or an inert-gas atmosphere of any other inert gas, different than Ar gas, such as He, Ne, or Kr gas. In this case, the moisture concentration of the inert gas or nitrogen gas is 1 ppm or less, and the concentration of oxygen of the inert gas or nitrogen gas is 1 ppm or less.

In the above embodiment, the metal which is mixed with metal Ga is sodium Na. Alternatively, alkali metals, such as lithium (Li) and potassium (K), or alkaline earth metals, such as magnesium (Mg), calcium (Ca) and strontium (Sr) may be mixed with metal Ga so that the mixed molten metal 290 is produced. In this case, the mixed molten metal in which the alkali metal is melted constitutes the molten alkali metal, and the mixed molten metal in which the alkaline earth metal is melted constitutes the molten alkaline earth metal.

Moreover, instead of nitrogen gas, any compound which contains nitrogen, such as sodium azide and ammonia, may be used. The compound constitutes the nitrogen material gas. Instead of Ga, any of group III metals, such as boron (B), aluminum (Al), and indium (In), may be used.

Generally, the crystal preparing device and method of this invention may be provided to produce a group III nitride crystal using the mixed molten metal of an alkali metal or an alkaline earth metal, and a group III metal (boron is included). The group III nitride crystal produced using the crystal preparing device or method of this invention is used for production of group III nitride semiconductor devices, such as a light emitting diode, a semiconductor laser, photodiode, and a transistor.

The present invention is applied to the crystal preparing device which carries out crystal growth of a group III nitride crystal with a controlled mixing ratio of an alkali metal and a group III metal. Moreover, the present invention is applied to the crystal preparing method which produces a group III nitride crystal with a controlled mixing ratio of an alkali metal and a group III metal.

Figure 19:
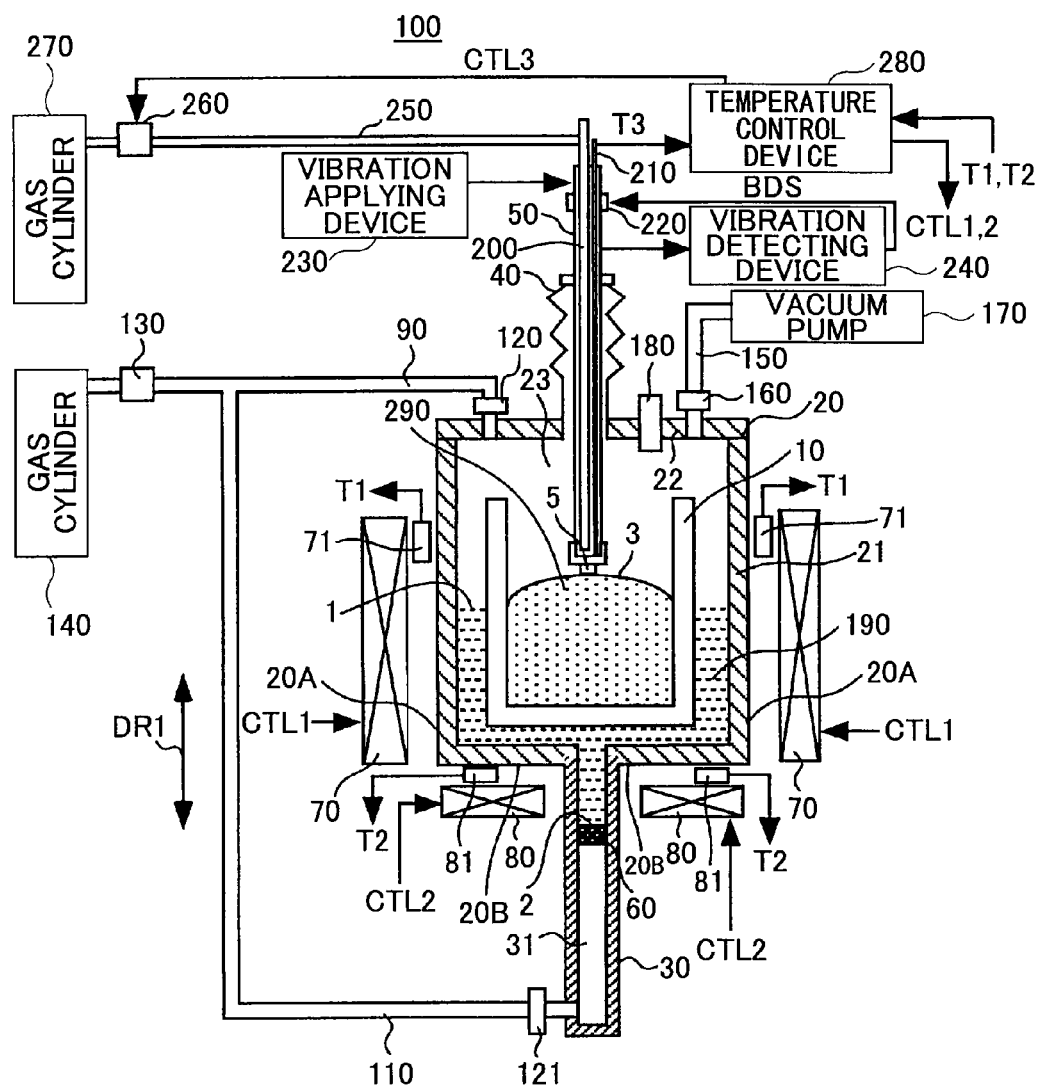
FIG. 19 is a diagram showing the composition of a crystal preparing device in an embodiment of the invention.

Next, FIG. 19 shows the composition of a crystal preparing device in an embodiment of the invention. As shown in FIG. 19, the crystal preparing device 100 in this embodiment includes a reaction container 10, an external reaction container 20, a piping 30, a piping 200, a bellows 40, a supporting device 50, a control/introduction plug 60, heating devices 70, heating devices 80, temperature sensors 71, 81, gas supply lines 90, 110, 250, a valve 120, a valve 121, a valve 160, a pressure regulator 130, gas cylinders 140, 270, an exhaust pipe 150, a vacuum pump 170, a pressure sensor 180, a molten metal 190, a thermocouple 210, an up-and-down movement device 220, a vibration applying device 230, a vibration detecting device 240, a flowmeter 260, and a temperature control device 280.

The reaction container 10 has a pillar-shaped configuration and includes boron nitride (BN). The external reaction container 20 separates a gap the reaction container 10 and predetermined, and is arranged around the reaction container 10. And the external reaction container 20 includes a body part 21 and a lid part 22.

Each of the body part 21 and the lid part 22 includes SUS316L, and the portion between the body part 21 and the lid part 22 is sealed with a metal O-ring. Therefore, metal Na is not leaked to the outside.

The piping 30 is connected with the external reaction container 20 with the reaction container 10 down side in gravity direction DR1. The bellows 40 is connected with the external reaction container 20 with the reaction container 10 up side in the gravity direction DR1.

The supporting device 50 is in the form of a hollow cylinder, and it is partially inserted into the space 23 of the external reaction container 20 through the bellows 40.

The control/introduction plug 60 is made of metal, ceramics, etc., and held in the piping 30 below the connection part of the external reaction container 20 and the piping 30.

The heating device 70 is arranged so that the outer peripheral surface 20A of the external reaction container 20 may be surrounded.

The heating devices 80 are arranged so that they confront the bottom 20B of the external reaction container 20. The temperature sensors 71 and 81 approach the heating devices 70 and 80, respectively, and are arranged.

One end of the gas supply line 90 is connected with the external reaction container 20 through the valve 120, and the other end thereof is connected with the gas cylinder 140 through the pressure regulator 130.

One end of the gas supply line 110 is connected with the piping 30 through the valve 121, and the other end thereof is connected with the gas supply line 90.

The gas supply line 90 includes the valve 120 near the external reaction container 20. The gas supply line 110 includes the valve 121 near the piping 30. The gas supply line 90 includes the pressure regulator 130 near the gas cylinder 140. The gas cylinder 140 is connected with the gas supply line 90.

One end of the exhaust pipe 150 is connected with the external reaction container 20 through the valve 160, and the other end thereof is connected with the vacuum pump 170. The exhaust pipe 150 includes the valve 160 near the external reaction container 20. The vacuum pump 170 is connected with the exhaust pipe 150.

The pressure sensor 180 is attached to the external reaction container 20. The molten metal 190 includes molten metal sodium (Na) and is held in the piping 30 and between the reaction container 10 and the external reaction container 20.

The piping 200 and the thermocouple 210 are inserted in the inside of the supporting device 50. The up-and-down movement device 220 is attached to the supporting device 50 at the location above the bellows 40. One end of the gas supply line 250 is connected to the piping 200, and the other end thereof is connected to the gas cylinder 270 through the flowmeter 260. The gas supply line 250 includes the flowmeter 260 near the gas cylinder 270. The gas cylinder 270 is connected with the gas supply line 250.

The reaction container 10 holds the mixed molten metal 290 containing metal Na and metal Ga (metal gallium). The external reaction container 20 is a wrap about the circumference of the reaction container 10.

The piping 30 leads the nitrogen gas (N2 gas) supplied from the gas cylinder 140 through the gas supply lines 90, 110 to the control/introduction plug 60.

The bellows 40 intercepts the inside and the outside of the external reaction container 20 while holding the supporting device 50. Moreover, the bellows 40 is expanded or contracted in the gravity direction DR1 in accordance with movement of the supporting device 50 in the gravity direction DR1. The supporting device 50 supports the seed crystal 5 (which includes a GaN crystal) at the end thereof which is inserted into the external reaction container 20.

The control/introduction plug 60 has a concavo-convex structure on its circumferential surface, and holes on the order of tens of micrometers are formed between the plug 60 and the wall of the piping 30, so that they passes the nitrogen gas through the piping 30 in the direction to the molten metal 190, and supplies the nitrogen gas into the space 23 through the molten metal 190.

Moreover, the control/introduction plug 60 holds the molten metal 190 by using the surface tension of the holes of tens of micrometers between the reaction container 10 and the external reaction container 20 and in the piping 30.

The heating device 70 includes a heater and a current source. And according to the control signal CTL1 from the temperature control device 280, the heating device 70 sends the current from the current source through the heater, and heats the reaction container 10 and the external reaction container 20 from the outer peripheral surface 20A of the external reaction container 20 to a crystal growth temperature.

The temperature sensor 71 detects the temperature T1 of the heater of the heating device 70, and outputs the detected temperature T1 to the temperature control device 280.

The heating device 80 also includes a heater and a current source. And according to control signal CTL2 from the temperature control device 280, the heating device 80 sends current from the current source through the heater, and heats the reaction container 10 and the external reaction container 20 from the bottom 20B of the external reaction container 20 to a crystal growth temperature. The temperature sensor 81 detects the temperature T2 of the heater of the heating device 80, and outputs the detected temperature T2 to the temperature control device 280.

The gas supply line 90 supplies the nitrogen gas fed from the gas cylinder 140 through the pressure regulator 130, to the external reaction container 20 through the valve 120. The gas supply line 110 supplies the nitrogen gas fed from the gas cylinder 140 through the pressure regulator 130, to the piping 30 through the valve 121.

The valve 120 supplies the nitrogen gas in the gas supply line 90 into the external reaction container 20, or stops supply into the external reaction container 20 of nitrogen gas. A valve 121 supplies the nitrogen gas in the gas supply line 110 to piping 30, or stops supply for the piping 30 of nitrogen gas. The pressure regulator 130 makes predetermined pressure the nitrogen gas from a gas cylinder 140, and supplies it to the gas supply line 90, 110.

The gas cylinder 140 holds nitrogen gas. The exhaust pipe 150 passes the gas in the external reaction container 20 to the vacuum pump 170. The valve 160 connects the exhaust pipe 150 spatially in the external reaction container 20, or intercepts the exhaust pipe 150 spatially in the external reaction container 20. The vacuum pump 170 performs vacuum suction in the external reaction container 20 through the exhaust pipe 150 and the valve 160.

The pressure sensor 180 detects the pressure in the external reaction container 20. Nitrogen gas is introduced through the molten metal 190 and the control/introduction plug 60 into the space 23.

The piping 200 supplies the nitrogen gas supplied from the gas supply line 250 to the supporting device 50, and cools the seed crystal 5. The thermocouple 210 detects the temperature T3 of the seed crystal 5, and outputs the detected temperature T3 to the temperature control device 280.

According to the vibration detection signal BDS from the vibration detecting device 240, the up-and-down movement device 220 moves up and down the supporting device 50 so that the seed crystal 5 may touch the gas-liquid interface 3 of space 23 and mixed molten metal 290.

The vibration applying device 230 includes, for example, a piezoelectric device, and applies vibrations having a predetermined frequency to the supporting device 50.

The vibration detecting device 240 includes, for example, an acceleration pickup and detects vibrations of the supporting device 50, and outputs the vibration detection signal BDS indicating vibrations of the supporting device 50, to the up-and-down movement device 220.

The gas supply line 250 supplies the nitrogen gas fed from the gas cylinder 270 through the flowmeter 260, to the piping 200. The flowmeter 260 adjusts the flow rate of the nitrogen gas supplied from the gas cylinder 270 according to the control signal CTL3 from the temperature control device 280, and supplies the nitrogen gas with the adjusted flow rate to the gas supply line 250. The gas cylinder 270 holds nitrogen gas.

The composition of the control/introduction plug 60 in FIG. 19 is as shown in FIG. 2. As shown in FIG. 2, the control/introduction plug 60 contains the plug 61 and the convex parts 62. The plug 61 has the cross-section in a generally circular shape. Each of the convex parts 62 has the cross-section in the shape of a semi-circle, and is formed on the outer peripheral surface of the plug 61 along the longitudinal direction DR2 of the plug 61.

The mounting state of the control/introduction plug 60 to the piping 30 is as shown in FIG. 3. As shown in FIG. 3, the plurality of convex parts 62 are formed in the circumferential direction of the plug 61, and the convex parts 62 are formed at intervals d on the order of tens of micrometers. Moreover, each of the convex parts 62 has the height H on the order of tens of micrometers.

The convex parts 62 in the control/introduction plug 60 are in contact with the wall 30A of the piping 30. Thereby, the control/introduction plug 60 is fitted into the wall 30A of the piping 30.

In the state where the control/introduction plug 60 is fitted into the wall 30A of the piping 30 a plurality of air gaps 63 each having a diameter on the order of 10 micrometers are formed in the outer peripheral surface of the plug 61 between the control/introduction plug 60 and the wall 30A of the piping 30.

The air gaps 63 hold the molten metal 190 by the surface tension of the molten metal 190, and prevent the passing of the molten metal 190 in the longitudinal direction DR2 of the plug 61. The air gaps 63 pass nitrogen gas in the longitudinal direction DR2 of the plug 61.

The composition of the supporting device 50, the piping 200, and the thermocouple 210 in FIG. 19 is as shown in FIG. 4A and FIG. 4B. As shown in FIG. 4A and FIG. 4B, the supporting device 50 contains the cylindrical member 51 and the holding members 52 and 53.

The cylindrical member 51 has the cross-section in a generally circular form. The holding member 52 has the cross-section in a generally L-shaped form, and is fixed at the end 511 of the cylindrical member 51 to the outer peripheral surface 51A and the bottom 51B of the cylindrical member 51.

Moreover, the holding member 53 has the cross-section in a generally L-shaped form, and is fixed to the outer peripheral surface 51A and the bottom 51B of the cylindrical member 51 so that it is symmetrically arranged with the holding member 52 at the end 511 of the cylindrical member 51. As a result, the space 54 is formed in the location surrounded by the cylindrical member 51 and the holding members 52 and 53.

The piping 200 has the cross-section in a generally circular shape, and is arranged inside the cylindrical member 51. In this case, the bottom 200A of the piping 200 is arranged so as to confront the bottom 51B of the cylindrical member 51. And a number of small holes 201 are formed in the bottom 200A of the piping 200. The nitrogen gas supplied into piping 200 is sprayed on the bottom 51B of the cylindrical member 51 through the small holes 201.

The thermocouple 210 is arranged inside the cylindrical member 51 so that the end 210A of the thermocouple 210 touches the bottom 51B of the cylindrical member 51 (see FIG. 4A).

And the seed crystal 5 is configured to have a shape which fits into the space 54, and it is supported by the supporting device 50 by fitting the same into the space 54. In this case, the seed crystal 5 touches the bottom 51B of the cylindrical member 51 (see FIG. 43). The seed crystal in this embodiment has the shape of the seed crystal 5 shown in FIG. 4B. Alternatively, if the seed crystal is in the shape which touches the supporting device 50, a hexagonal shape seed crystal may be held using an adapter which has the shape of the seed crystal 5 shown in FIG. 43.

Therefore, the thermal conductivity between the seed crystal 5 and the cylindrical member 51 becomes high. As a result, the temperature of the seed crystal 5 can be detected using the thermocouple 210, and the seed crystal 5 can be easily cooled with the nitrogen gas sent to the bottom 51B of the cylindrical member 51 from the piping 200.

The composition of the up-and-down movement device 220 in FIG. 19 is as shown in FIG. 5. As shown in FIG. 5, the up-and-down movement device 220 contains the rack member 221, the gear 222, the shaft member 223, the motor 224, and the control unit 225.

The rack member 221 has the cross-section in a generally triangular shape, and is fixed to the outer peripheral surface 51A of the cylindrical member 51. The gear 222 is fixed to the end of the shaft member 223, and the gear 222 is engaged with the rack member 221. One end of the shaft member 223 is connected with the gear 222, and the other end thereof is connected with the shaft (not shown) of the motor 224.

The motor 224 rotates the gear 222 in the direction indicated by the arrow 226 or 227 in accordance with the control signal from the control unit 225. The control unit 225 controls the motor 224 based on the vibration detection signal BDS from the vibration detecting device 240 so that the gear 222 is rotated in the direction indicated by the arrow 226 or 227.

When the gear 222 is rotated in the direction indicated by the arrow 226, the supporting device 50 is moved upward in the gravity direction DR1. When the gear 222 is rotated in the direction indicated by the arrow 227, the supporting device 50 is moved downward in the gravity direction DR1. Therefore, rotating the gear 222 in the direction indicated by the arrow 226 or 227 is equivalent to moving the supporting device 50 up and down in the gravity direction DR1.

Figure 20:
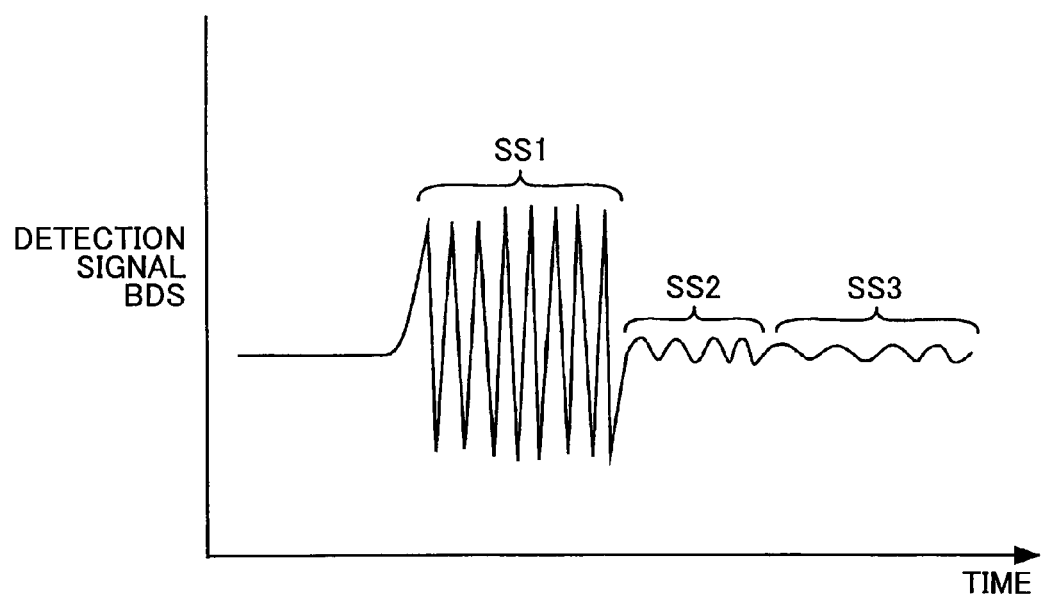
FIG. 20 is a timing chart of an vibration detection signal.

FIG. 20 is a timing chart of the vibration detection signal BDS. As shown in FIG. 20, the vibration detection signal BDS detected by the vibration detecting device 240 includes the signal component SS1 when the seed crystal 5 is not in contact with the mixed molten metal 290. The vibration detection signal BDS includes the signal component SS2 when the seed crystal 5 is in contact with the mixed molten metal 290. The vibration detection signal BDS includes the signal component SS3 when the seed crystal 5 is immersed in the mixed molten metal 290.

The seed crystal 5 vibrates greatly by the vibrations applied by the vibration applying device 230 when the seed crystal 5 is not in contact with the mixed molten metal 290, and the vibration detection signal BDS at this time includes the signal component SS1 having a relatively large amplitude.

On the other hand, when the seed crystal 5 is in contact with the mixed molten metal 290, the seed crystal 5 does not vibrate greatly according to the viscosity of the mixed molten metal 290 even if the vibrations are applied by the vibration applying device 230, and the vibration detection signal BDS at this time includes the signal component SS2 having a relatively small amplitude.

Moreover, when the seed crystal 5 is immersed in the mixed molten metal 290, the seed crystal 5 becomes further difficult to vibrate according to the viscosity of the mixed molten metal 290, and the vibration detection signal BDS at this time includes the signal component SS3 having an amplitude smaller than that of the signal component SS2.

Referring back to FIG. 5, when the vibration detection signal BDS is received from the vibration detecting device 240, the control unit 225 detects the signal component in the vibration detection signal BDS. And when the detected signal component includes the signal component SS1, the control unit 225 controls the motor 224 so that the supporting device 50 is moved down in the gravity direction DR1 until the detected signal component in the vibration detection signal BDS is changed to the signal component SS2.

Specifically, the control unit 225 controls the motor 224 to rotate the gear 222 in the direction indicated by the arrow 227, and the motor 224 rotates the gear 222 in the direction indicated the arrow 227 through the shaft member 223 according to the control signal from the control unit 225. Thereby, the supporting device 50 is moved downward in the gravity direction DR1.

And when the signal component in the vibration detection signal BDS received from the vibration detecting device 240 is changed from the signal component SS1 to the signal component SS2, the control unit 225 controls the motor 224 to suspend rotation of the gear 222, the motor 224 stops rotation of the gear 222 according to the control signal from the control unit 225. Thereby, the supporting device 50 suspends movement and holds the seed crystal 5 in contact with the gas-liquid interface 3.

On the other hand, when the vibration detection signal BDS including the signal component SS2 is received from the vibration detecting device 240, the control unit 225 controls the motor 224 to suspend movement of the supporting device 50. In this case, the seed crystal 5 is already in contact with the mixed molten metal 290.

In this manner, based on the vibration detection signal BDS detected by the vibration detecting device 240, the up-and-down movement device 220 moves the supporting device 50 up or down in the gravity direction DR1 so that the seed crystal 5 may touch the mixed molten metal 290.

Figure 21:
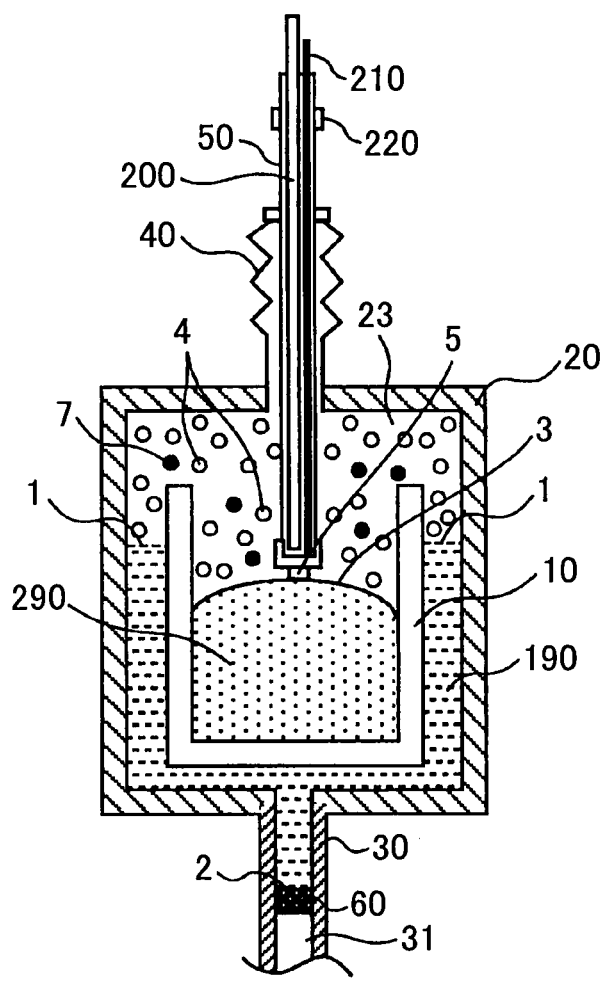
FIG. 21 is a diagram showing the state in the reaction container and the external reaction container between timing t1 and timing t2 shown in FIG. 7.

The timing chart of the temperature of the reaction container 10 and the external reaction container 20 is as shown in FIG. 7. FIG. 21 shows the state in the reaction container 10 and the external reaction container 20 between timing t1 and timing t2 shown in FIG. 7. And the relation between the temperature of the seed crystal 5 and the flow rate of nitrogen gas is as shown in FIG. 10.

In FIG. 7, the straight line k1 shows the temperature of the reaction container 10 and the external reaction container 20, and the curve k2 and the straight line k3 show the temperature of the seed crystal 5.

As shown in FIG. 7, the heating devices 70 and 80 heat the reaction container 10 and the external reaction container 20 so that the temperature is increased to 800 degrees C. according to the straight line k1 and the temperature is held at 800 degrees C.

In this case, the reaction container 10 and the external reaction container 20 are filled up with the nitrogen gas of 1.01-5.05 MPa. If the heating devices 70 and 80 begin to heat the reaction container 10 and the external reaction container 20, the temperature of the reaction container 10 and the external reaction container 20 begins to rise. In timing t1, the temperature exceeds 98 degrees C., and in timing t2 the temperature is increased to 800 degrees C.

At this time, metal Na held between the reaction container 10 and the external reaction container 20 is melt, and it becomes the molten metal 190 (=molten metal Na). Moreover, metal Na and metal Ga which are held in the reaction container 10 are also melt, and they become the mixed molten metal 290.

And the nitrogen gas 4 in the space 23 cannot be diffused to the space 31 in the piping 30 through the molten metal 190 (=molten metal Na) and the control/introduction plug 60, but it is enclosed in the space 23.

Moreover, the quantity of Na which evaporates from the molten metal 190 and the mixed molten metal 290 to the space 23 increases as the temperature of the reaction container 10 and the external reaction container 20 approaches 800 degrees C. And the Na vapor is confined in the space 23 as the metal Na vapor 7. Therefore, the nitrogen gas 4 and the metal Na vapor 7 coexist in the space 23 after timing t1 (see FIG. 21).

Moreover, in the timing t2 in which the temperature of the reaction container 10 and the external reaction container 20 rises to 800 degrees C., the up-and-down movement device 220 moves up or down the supporting device 50 based on the vibration detection signal BDS from the vibration detecting device 240 by the above-mentioned method, so that the seed crystal 5 contacts the mixed molten metal 290.

And in the state in which the temperature of the reaction container 10 and the external reaction container 20 is high (about 800 degrees C.), the nitrogen gas 4 in the space 23 is captured into the mixed molten metal 290 through the metal Na. In this case, the nitrogen concentration in the mixed molten metal 290 or the concentration of $Ga_xN_y$ (where x and y are real numbers) is the highest in the vicinity of the gas-liquid interface 3 of the space 23 and the mixed molten metal 290, a GaN crystal begins to grow from the seed crystal 5 which is in contact with the gas-liquid interface 3.

When nitrogen gas is not into the piping 200, the temperature T3 of the seed crystal 5 is the same (800 degrees C.) as the temperature of the mixed molten metal 290. In this embodiment, in order to raise the degree of supersaturation of nitrogen or group III nitride in the mixed molten metal 290 of the seed crystal 5 neighborhood, nitrogen gas is supplied into the piping 200, so that the seed crystal 5 is cooled and the temperature T3 of the seed crystal 5 is made lower than the temperature of the mixed molten metal 290.

More specifically, after timing t2, the temperature T3 of the seed crystal 5 is set to the temperature Ts1 which is lower than 800 degrees C. according to the curve k2. This temperature Ts1 is 790 degrees C., for example.

The method of setting the temperature T3 of the seed crystal 5 to the temperature Ts1 is essentially the same as that in the previously described embodiment of FIG. 7.

There are two reasons the difference between the temperature (=800 degrees C.) of the mixed molten metal 290 and the temperature T3 of the seed crystal 5 is gradually increased in this embodiment. The first reason is that a GaN crystal adheres to the seed crystal 5 with advance of the crystal growth of the GaN crystal. If the temperature of the seed crystal 5 is not decreased gradually, it becomes difficult to set the temperature of the GaN crystal produced through crystal growth from the seed crystal 5 to a temperature lower than the temperature of the mixed molten metal 290. The second reason is that Ga in the mixed molten metal 290 is consumed with advance of the crystal growth of a GaN crystal, the ratio γ=Na/(Na+Ga) becomes large, and the degree of supersaturation of the nitrogen concentration in the mixed molten metal 290 or the group III nitride concentration becomes small. If the temperature of the seed crystal 5 is not decreased gradually, it becomes difficult to hold the nitrogen concentration in the mixed molten metal 290 or the group III nitride concentration to supersaturation.

Moreover, by decreasing the temperature of the seed crystal 5 gradually with advance of the crystal growth of a GaN crystal, the degree of supersaturation of the nitrogen in the mixed molten metal 290 of the seed crystal 5 neighborhood or the group III nitride becomes large gradually, and the growth rate of a GaN crystal becomes quick with advance of crystal growth. As a result, it is possible to increase the size of a GaN crystal more quickly.

Figure 22:
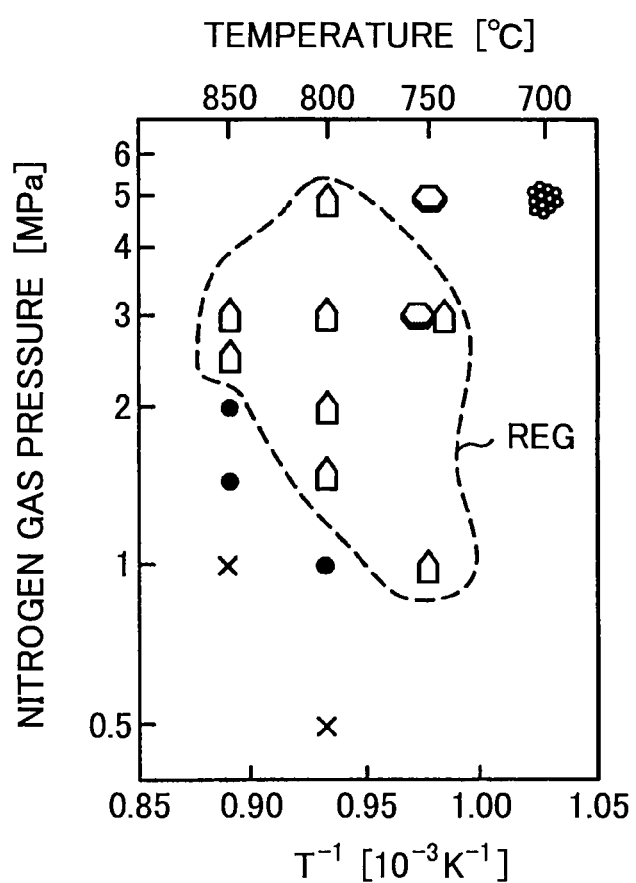
FIG. 22 is a diagram showing the relation between the nitrogen gas pressure and the crystal growth temperature in the case of growing up a GaN crystal.

When performing crystal growth of the GaN crystal in the crystal preparing device 100, the seed crystal 5 is a GaN crystal which is produced through crystal growth without using the seed crystal 5 in the crystal preparing device 100. FIG. 22 is a diagram showing the relation between the nitrogen gas pressure and the crystal growth temperature in the case of growing up a GaN crystal.

In FIG. 22, the horizontal axis indicates the crystal growth temperature and the vertical axis indicates the nitrogen gas pressure. In FIG. 22, the region REG is a region in which a pillar-shaped GaN crystal grows up in the direction of c axis (<0001>) in the bottom and the side which touch the mixed molten metal 290 of the reaction container 10.

Therefore, when producing the seed crystal 5, a GaN crystal is grown up using the nitrogen gas pressure and the crystal growth temperature which are located in the region REG. In this case, many cores occur on the bottom and the side wall in the reaction container 10, and a pillar-shaped GaN crystal which is grown up in the direction of c axis is produced. And a GaN crystal is selected from among many GaN crystals produced through crystal growth, and cut into the shape shown in FIG. 4A, so that the seed crystal 5 is produced. Therefore, the projection part 5A (see FIG. 4B) of the seed crystal 5 includes the GaN crystal grown up in the direction of c axis (<0001>). The thus produced seed crystal 5 is fitted in the space 54 of the supporting device 50 and it is fixed to the supporting device 50.

Figure 23:
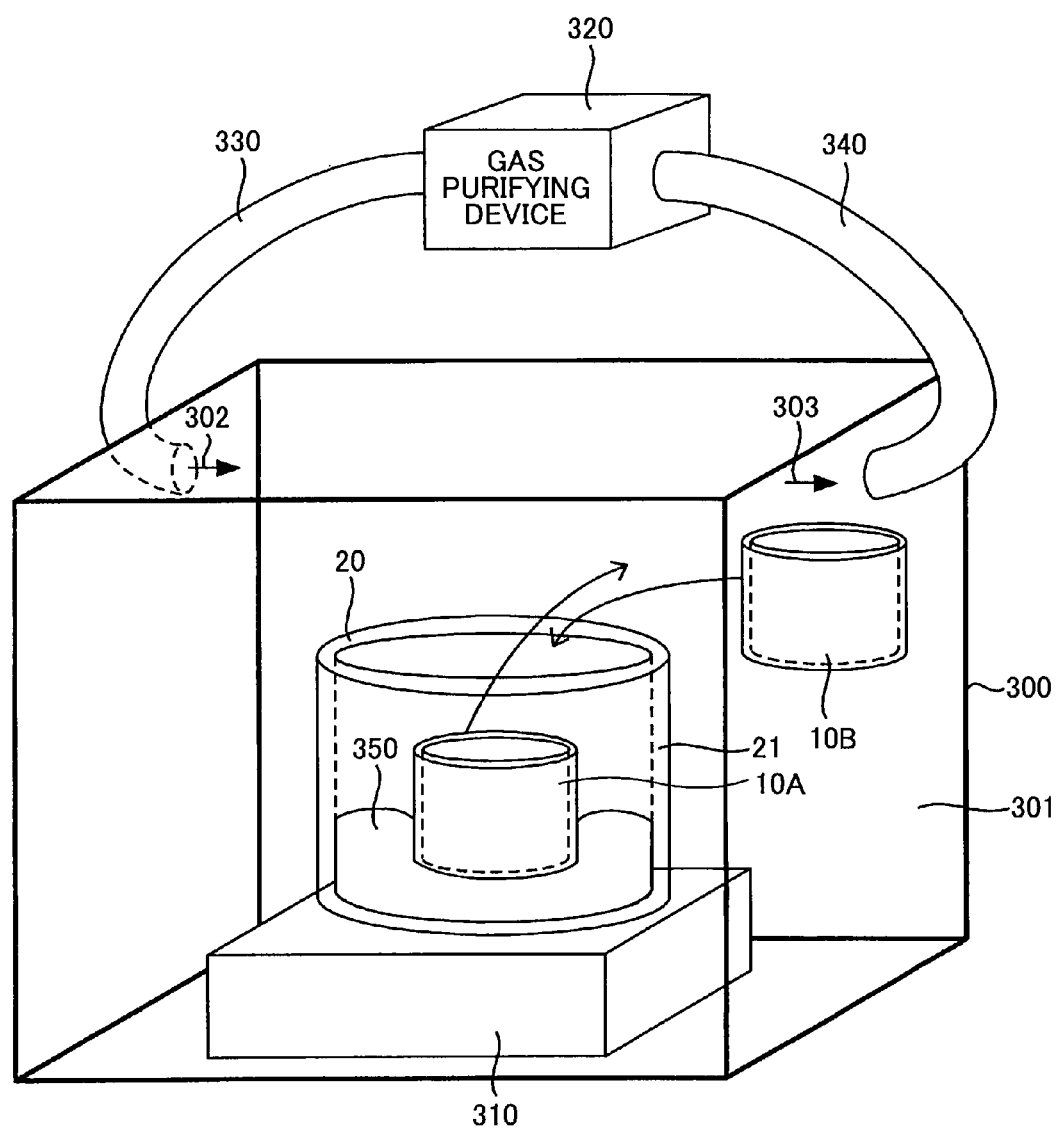
FIG. 23 is a diagram for explaining the method of setting metal Na and metal Ga to a reaction container and an external reaction container.

FIG. 23 is a diagram for explaining the method of setting metal Na and metal Ga to the reaction container 10 and the external reaction container 20. As shown in FIG. 23, the glove box 300 contains a heater 310 inside. And the interior space 301 of the glove box 300 is filled up with Ar gas.

The gas purification device 320 is connected with the glove box 300 with the pipes 330 and 340. Moreover, the gas purification device 320 is connected with the gas cylinder (not shown) which is filled up with Ar gas.

The gas purification device 320 receives Ar gas from the gas cylinder and purifies the received Ar gas. And the gas purification device 320 supplies the purified Ar gas to the interior space 301 of the glove box 300 through the pipe 330.

Moreover, the gas purification device 320 attracts Ar gas from the interior space 301 of the glove box 300 through the pipe 340, purifies the attracted Ar gas, and supplies the same to the interior space 301 of the glove box 300. That is, the gas purification device 320 performs circulation of Ar gas between the device 320 and the interior space 301 of the glove box 300 as indicated by the arrows 302 and 303.

The gas purification device 320 purifies Ar gas by reducing the oxygen concentration and the moisture concentration in the Ar gas to 10 ppm or less. Preferably, the gas purification device 320 purifies Ar gas by reducing the oxygen concentration and the moisture concentration in the Ar gas in a range of 0.1-10 ppm. Still more preferably, the gas purification device 320 purifies Ar gas by reducing the oxygen concentration and the moisture concentration in Ar gas to less than 0.1 ppm.

Moreover, the gas purification device 320 purifies Ar gas by reducing the oxygen concentration in the Ar gas to a 10 ppb level, and reducing the moisture concentration to 10 ppm or less. Preferably, the gas purification device 320 purifies Ar gas by reducing the oxygen concentration in the Ar gas to a 10 ppb level and reducing the moisture concentration in the range of 0.1-10 ppm. Still more preferably, the gas purification device 320 purifies Ar gas by reducing the oxygen concentration in the Ar gas to a 10 ppb level and reducing the moisture concentration to less than 0.1 ppm.

Furthermore, the gas purification device 320 purifies Ar gas by reducing the moisture concentration in Ar gas to a 10 ppb level and reducing the oxygen concentration to 10 ppm or less. Preferably, the gas purification device 320 purifies Ar gas by reducing the moisture concentration in the Ar gas to a 10 ppb level and reducing the oxygen concentration in the range of 0.1-10 ppm. Still more preferably, the gas purification device 320 purifies Ar gas by reducing the moisture concentration in the Ar gas to a 10 ppb level and reducing the oxygen concentration to less than 0.1 ppm.

Since the oxygen concentration or moisture concentration of a 10 ppb level is lower than the moisture concentration or oxygen concentration of a 10 ppm level by triple figures, it can be disregarded when compared with the moisture concentration or oxygen concentration of a 10 ppm level.

Therefore, the gas purification device 320 performs the Ar gas purification in any of the following eight patterns:
(A) reduce oxygen concentration and moisture concentration in the range of 0.1-10 ppm;
(B) reduce oxygen concentration to less than 0.1 ppm and reduce moisture concentration in the range of 0.1-10 ppm;
(C) reduce oxygen concentration in the range of 0.1-10 ppm and reduce moisture concentration to less than 0.1 ppm;
(D) reduce moisture concentration in the range of 0.1-10 ppm;
(E) reduce oxygen concentration and moisture concentration to less than 0.1 ppm;
(F) reduce moisture concentration to less than 0.1 ppm;
(G) reduce oxygen concentration in the range of 0.1-10 ppm; and
(H) reduce oxygen concentration to less than 0.1 ppm.

Since the purification patterns (D) and (F) mean reducing the oxygen concentration to a 10 ppb level, it is changed to reducing only the moisture concentration to a predetermined concentration. Similarly, since the purification patterns (G) and (H) mean reducing the moisture concentration to a 10 ppb level, it is changed to reducing only the oxygen concentration to a predetermined concentration.

One purification pattern is selected from among the above-mentioned 8 purification patterns (A)-(H), the gas purification device 320 purifies Ar gas using the se and supplies the purified Ar gas to the interior space 301 of the glove box 300.

In order to use the purification patterns (A)-(H) for Ar gas purification, the gas purification device 320 is provided with corresponding filters F1-F8, respectively. The filter F1 is a filter which reduces both the oxygen concentration and the moisture concentration in Ar gas to the range of 0.1-10 ppm. The filter F2 is a filter which reduces the oxygen concentration to less than 0.1 ppm, and reduces the moisture concentration to the range of 0.1-10 ppm.

Moreover, the filter F3 is a filter which reduces the oxygen concentration to the range of 0.1-10 ppm, and reduces the moisture concentration to less than 0.1 ppm. The filter F4 is a filter which reduces the oxygen concentration to a 10 ppb level, and reduces the moisture concentration to the range of 0.1-10 ppm.

Furthermore, the filter F5 is a filter which reduces both the oxygen concentration and the moisture concentration to less than 0.1 ppm. The filter F6 is a filter which reduces the oxygen concentration to a 10 ppb level, and reduces the moisture concentration to less than 0.1 ppm.

Furthermore, the filter F7 is a filter which reduces the moisture concentration to a 10 ppb level, and reduces the oxygen concentration to the range of 0.1-10 ppm. The filter F8 is a filter which reduces the moisture concentration to a 10 ppb level, and reduces the oxygen concentration to less than 0.1 ppm.

Therefore, any of the filters F1-F8 mentioned above is chosen and the chosen filter is installed in to the gas purification device 320. And with the installed filter, the gas purification device 320 reduces the oxygen concentration and the moisture concentration in Ar gas to the predetermined range, and supplies the purified Ar gas to the interior space 301 of the glove box 300.

After the crystal growth of the GaN crystal in the crystal preparing device 100 is completed, the external reaction container 20 is removed from the crystal preparing device 100, and is installed on the heater 310 of the glove box 300.

Then, the heater 310 is turned on and the reaction container 10A and the external reaction container 20 are heated at 100 degrees C. or higher. And metal Na solidified between the reaction container 10A and the external reaction container 20 is melt, and it becomes the molten metal 350. When the molten metal 350 is produced between the reaction container 10A and the external reaction container 20, the reaction container 10A is in a removable state. The reaction container 10A is changed with a new reaction container 10B.

Then, melting the metal Na, it is put into the new reaction container 10B, and the heater 310 is turned off. The molten metal 350 and the metal Na put in the reaction container 10B will be solidified. Subsequently, metal Ga is put into the reaction container 10B. If metal Ga is put into the reaction container 10B after metal Na solidifies, the reaction of metal Na and metal Ga can be prevented and metal Na and metal Ga can be put into the reaction container 10B.

After metal Na and metal Ga are put into the reaction container 10B, metal Na is filled up between the reaction container 10B and the external reaction container 20 if needed. And the seed crystal 5 is placed in the supporting device 50, the lid part 22 (not shown) is attached to close the body part 21 of the external reaction container 20, and the portion between the body part 21 and the lid parts 22 is sealed with the metal seal.

Then, the external reaction container 20 is taken out from the glove box 300, and the external reaction container 20 is set to the crystal preparing device 100.

As described above, metal Na and metal Ga are set to the reaction container 10 and the external reaction container 20 in an Ar gas atmosphere where the quantity of oxygen and/or moisture is reduced to 10 ppm or less, and the external reaction container 20 is set to the crystal preparing device 100.

Figure 24:
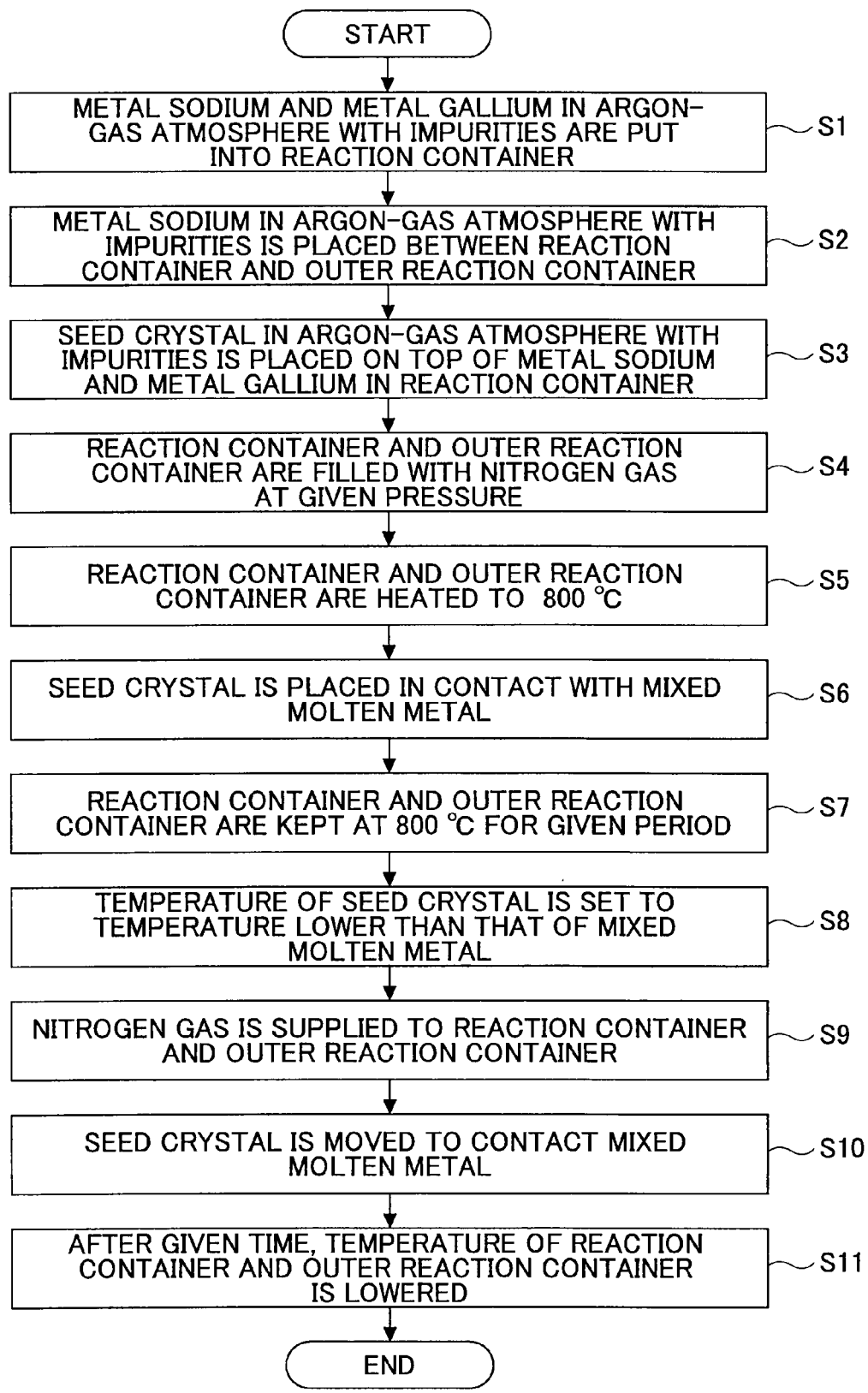
FIG. 24 is a flowchart for explaining the crystal preparing method of a GaN crystal.

FIG. 24 is a flowchart for explaining the crystal preparing method of a GaN crystal.

Upon start of the crystal preparing method of FIG. 24, the reaction container 10 and the external reaction container 20 are put into the glove box 300 which is filled up with Ar gas and contains a predetermined amount of impurities. In addition, the predetermined amount of impurities in this embodiment means oxygen in a concentration of 10 ppm or less, and/or moisture in a concentration of 10 ppm or less.

And metal Na and metal Ga are put into the reaction container 10 in the Ar gas atmosphere containing the predetermined amount of impurities (step S1). In this case, metal Na and metal Ga are put into the reaction container 10 in the mole ratio of 5:5.

Then, metal Na is placed between the reaction container 10 and the external reaction container 20 in the Ar gas atmosphere containing the predetermined amount of impurities (step S2). And the seed crystal 5 is placed on top of the metal Na and metal Ga in the reaction container 10 in the Ar gas atmosphere containing the predetermined amount of impurities (step S3).

Specifically, the seed crystal 5 is placed on top of the metal Na and metal Ga in the reaction container 10 by fitting the seed crystal 5 into the space 54 which is formed at the end 511 of the supporting device 50 (see FIG. 4B).

Then, the reaction container 10 and the external reaction container 20 are taken out from the glove box 300, and the reaction container 10 and the external reaction container 20 are set as the crystal preparing device 100 in the state where it is filled up with Ar gas in the reaction container 10 and the external reaction container 20.

And the valve 160 is opened and Ar gas with which it filled up in the reaction container 10 and the external reaction container 20 with the vacuum pump 170 is exhausted.

After carrying out vacuum suction of the inside of the reaction container 10 and the external reaction container 20 to the predetermined pressure (0.133 Pa or less) using the vacuum pump 170, the valve 160 is closed and the valves 120,121 are opened so that the nitrogen gas is supplied from the gas cylinder 140 to the reaction container 10 and the external reaction container 20 through the gas supply lines 90,110.

In this case, nitrogen gas is supplied into the reaction container 10 and the external reaction container 20 so that the pressure in the reaction container 10 and the external reaction container 20 may be set to about 0.1 MPa(s) using the pressure regulator 130.

And when the pressure in the external reaction container 20 detected by the pressure sensor 180 is set to about 0.1 MPa, the valve 160 is opened and the valves 120,121 are closed so that the nitrogen gas which is filled in the reaction container 10 and the external reaction container 20 is exhausted using the vacuum pump 170.

Also in this case, vacuum suction of the inside of the reaction container 10 and the external reaction container 20 to the predetermined pressure (0.133 Pa or less) is performed using the vacuum pump 170.

And the supply of the nitrogen gas to the reaction container 10 and the external reaction container 20 and the vacuum suction of the inside of the reaction container 10 and the external reaction container 20 is repeatedly performed several times.

Then, after carrying out vacuum suction of the inside of the reaction container 10 and the external reaction container 20 to the predetermined pressure by the vacuum pump 170, the valves 120,121 are opened and the valve 160 is closed so that the nitrogen gas is supplied into the reaction container 10 and the external reaction container 20 to make the pressure in the reaction container 10 and the external reaction container 20 is in the range of 1.01-5.05 MPa by the pressure regulator 130 (step S4).

In this case, metal Na between the reaction container 10 and the external reaction container 20 is solid, and nitrogen gas is supplied from the space 31 of the piping 30 to the space 23 in the external reaction container 20 through the control/introduction plug 60.

And the valve 120 is closed when the pressure in the space 23 detected by the pressure sensor 180 is set to 1.01-5.05 MPa.

Then, the reaction container 10 and the external reaction container 20 are heated to 800 degrees C. by the heating devices 70 and 80 (step S5). In this case, the melting point of the metal Na held between the reaction container 10 and the external reaction container 20 is about 98 degrees C., and it is melt in the process in which the reaction container 10 and the external reaction container 20 are heated to 800 degrees C., and it becomes the molten metal 190. And the gas-liquid interfaces 1 and 2 occur (see FIG. 19). The gas-liquid interface 1 is located in the interface of the molten metal 190 and the space 23 in the external reaction container 20, and the gas-liquid interface 2 is located in the interface of the molten metal 190 and the control/introduction plug 60.

Moreover, when the temperature of the reaction container 10 and the external reaction container 20 is increased to 800 degrees C., the temperature of the control/introduction plug 60 is 150 degrees C. Therefore, the vapor pressure of the molten metal 190 (=molten metal Na) in the gas-liquid interface 2 is $7.6 \times 10^{-4}$ Pa, and the molten metal 190 (=molten metal Na) hardly evaporates through the air gap 63 of the control/introduction plug 60. As a result, the molten metal 190 (=metal Na melt) hardly decreases.

Even if the temperature of the control/introduction plug 60 is increased to 300 degrees C. or 400 degrees C., the vapor pressure of molten metal 190 (=metal Na melt) is 1.8 Pa or 47.5 Pa, and the decrease of the molten metal 190 (=metal Na melt) with the vapor pressure of this level can be disregard.

Thus, in the crystal preparing device 100, the temperature of the control/introduction plug 60 is set to the temperature at which the molten metal 190 (=metal Na melt) does not decrease substantially by evaporation.

Furthermore, in the process in which the reaction container 10 and the external reaction container 20 are heated to 800 degrees C., metal Na and metal Ga in the reaction container 10 become fluid, and the mixed molten metal 290 of metal Na and metal Ga is produced in the reaction container 10. And the up-and-down movement device 220 contacts the seed crystal 5 to the mixed molten metal 290 by the method mentioned above (step S6).

Furthermore, if the temperature of the reaction container 10 and the external reaction container 20 is increased to 800 degrees C., the nitrogen gas in the space 23 is captured into the mixed molten metal 290 through metal Na, and a GaN crystal begins to grow from the seed crystal 5.

Then, the temperature of the reaction container 10 and the external reaction container 20 is held for a predetermined time (tens of hours-hundreds of hours) at 800 degrees C. (step S7). And the temperature T3 of the seed crystal 5 is set to a temperature Ts1 (or temperature Ts2) which is lower than the temperature (=800 degrees C.) of the mixed molten metal 290 by the above-mentioned method (step S8).

And when the growth of a GaN crystal advances, the nitrogen gas in the space 23 will be consumed and the nitrogen gas in the space 23 is decreased. Then, the pressure P1 in the space 23 is lower than the pressure P2 of the space 31 in the piping 30 (P1<P2), and a differential pressure occurs between the inside of the space 23 and the inside of the space 31, and the nitrogen gas of the space 31 is supplied gradually into the space 23 through the control/introduction plug 60 and the molten metal 190 (=metal Na melt) (step S9).

Then, the seed crystal 5 is dropped by the method mentioned above so that the seed crystal 5 contacts the mixed molten metal 290 (step S10). Thereby, a GaN crystal having a large size grows.

After a predetermined time passes, the temperature of the reaction container 10 and the external reaction container 20 is lowered (step S11), and the preparation of a GaN crystal is completed.

Figure 25:
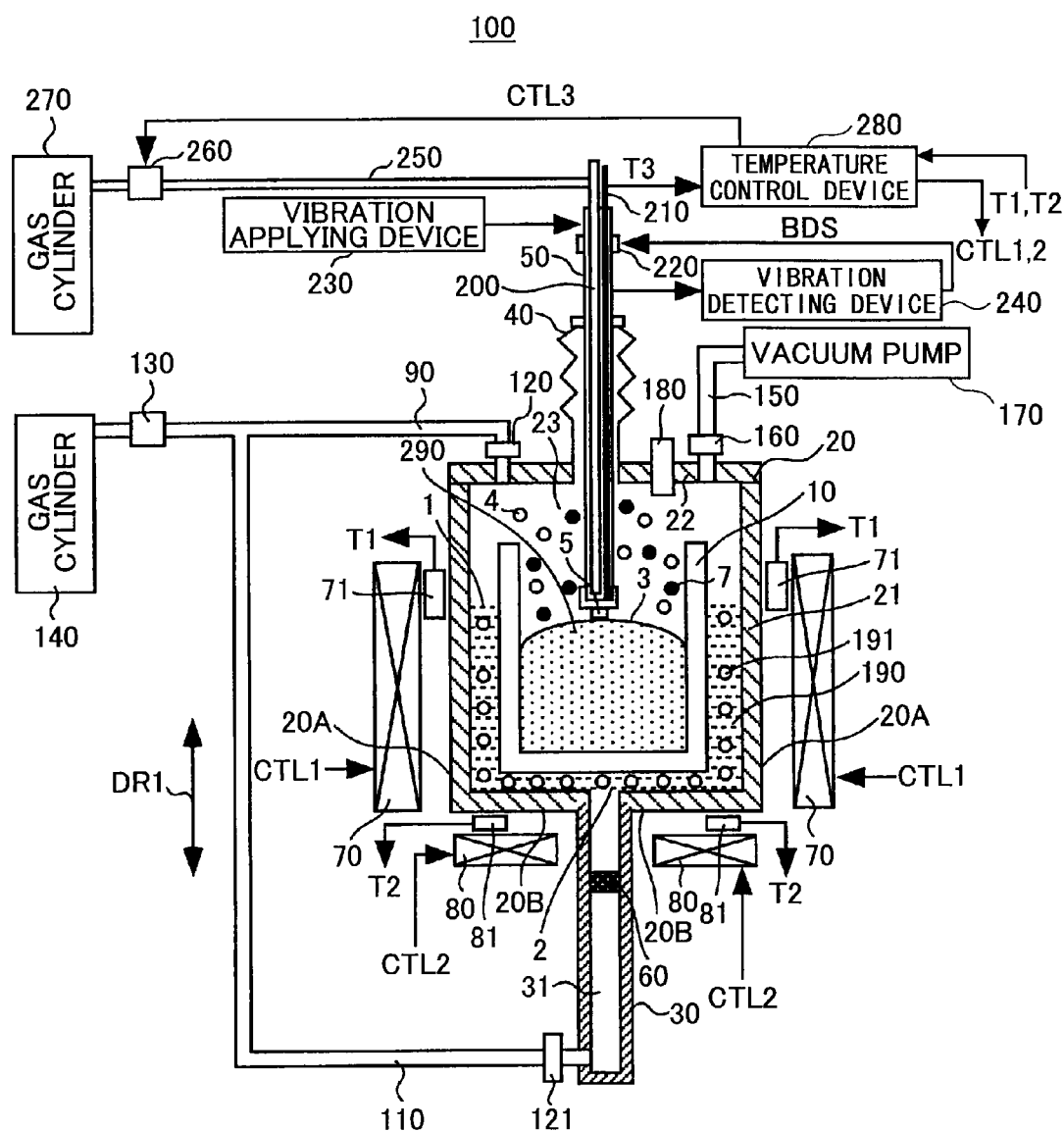
FIG. 25 is a diagram showing the state in the reaction container and the external reaction container in step S9 shown in FIG. 24.

FIG. 25 shows the state in the reaction container 10 and the external reaction container 20 in the step S9 shown in FIG. 24. As shown in FIG. 25, the temperature of the reaction container 10 and the external reaction container 20 is held at 800 degrees C. from timing t2 to timing t4, and the growth of a GaN crystal in the mixed molten metal 290 advances. At this time, metal Na evaporates from the molten metal 190 and the mixed molten metal 290, and the nitrogen gas 4 and the metal Na vapor 7 coexist in the space 23.

And the pressure P1 in the space 23 is lower than the pressure P2 of the space 31 in the piping 30 by the consumption of the nitrogen gas 4. Then, the molten metal 190 moves to the space 23 and the gas-liquid interfaces 1 and 2 of the molten metal 190 go up.

In such a state, nitrogen gas is supplied from the space 31 of the piping 30 to the molten metal 190 through the control/introduction plug 60, and a bubble 191 is moved in the inside of molten metal 190, and it is supplied to the space 23 from the gas-liquid interface 1. And when the pressure P1 in the space 23 becomes almost the same as the pressure P2 in the space 31, the molten metal 190 is lowered to the original position, and the supply of nitrogen gas from the space 31 of the piping 30 to the reaction container 10 and the external reaction container 20 through the control/introduction plug 60 and the molten metal 190 is stopped.

Thus, the control/introduction plug 60 supplies nitrogen gas into the reaction container 10 and the external reaction container 20 from the space 31 in the piping 30 while the plug 60 holds the molten metal 190 (=metal Na melt) between the reaction container 10 and the external reaction container 20 by the surface tension of the molten metal 190. Therefore, the control/introduction plug 60 has the structure which prevents the passage of molten metal 190.

Figure 26:
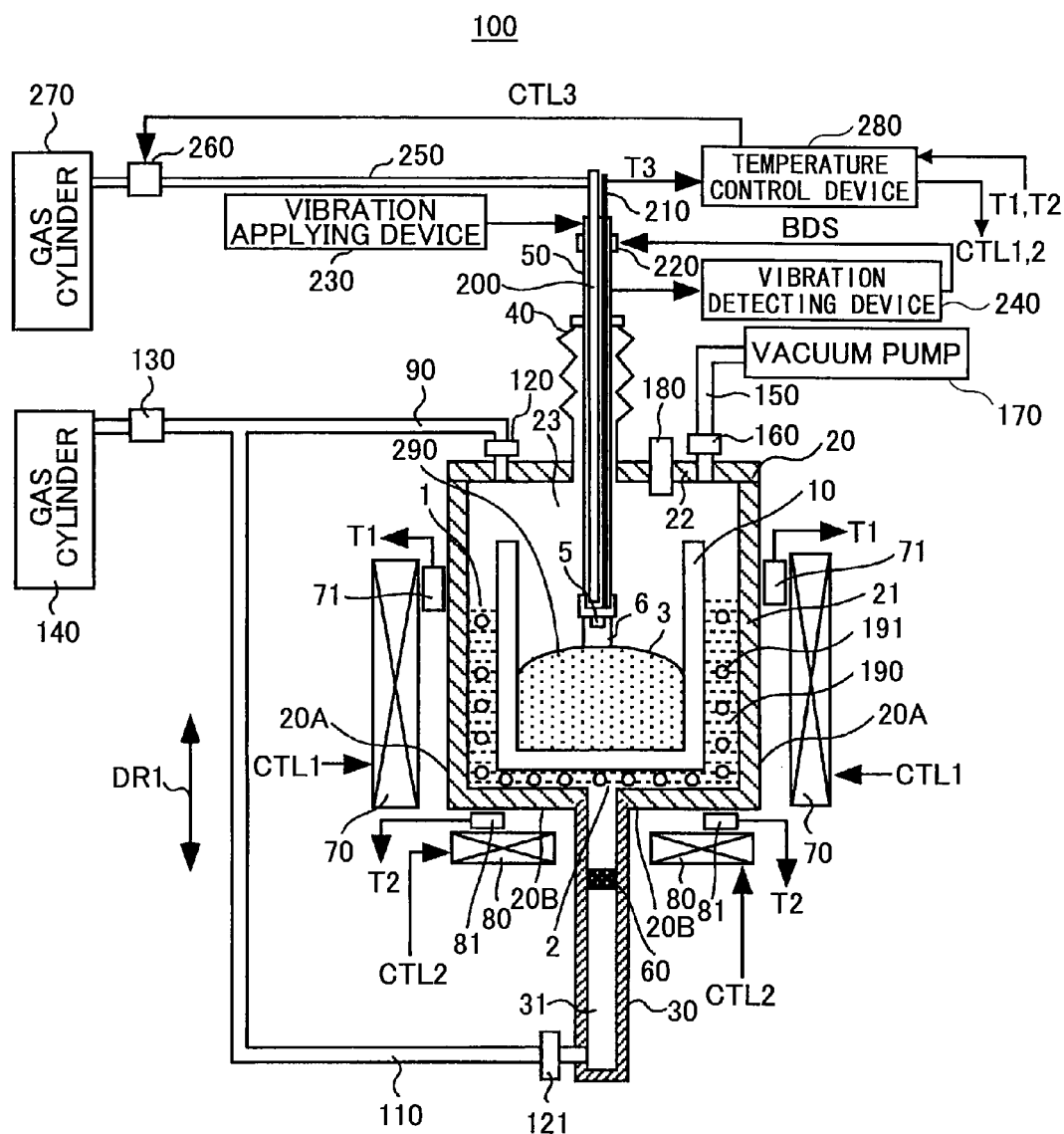
FIG. 26 is a diagram showing the state in the reaction container and the external reaction container in step S10 shown in FIG. 24.

FIG. 26 shows the state in the reaction container 10 and the external reaction container 20 in step S10 shown in FIG. 24. If the crystal growth of a GaN crystal advances and the mixed molten metal 290 decreases, the gas-liquid interface 3 is lowered and the GaN crystal 6 produced from the seed crystal 5 is separated from the mixed molten metal 290.

The vibration detection signal BDS at this time includes the signal component SS1 (shown in FIG. 20), and the up-and-down movement device 220 lowers the supporting device 50 through the above-mentioned method based on the vibration detection signal BDS so that the GaN crystal 6 contacts the mixed molten metal 290. Thereby, the GaN crystal 6 contacts the mixed molten metal 290 again, and the GaN crystal 6 grows preferentially.

Thus, the seed crystal 5 or the GaN crystal 6 which is produced through crystal growth from the seed crystal 5 is always contacted to the mixed molten metal 290 during the crystal growth of the GaN crystal. Therefore, a GaN crystal having a large size can be produced.

Figure 27:
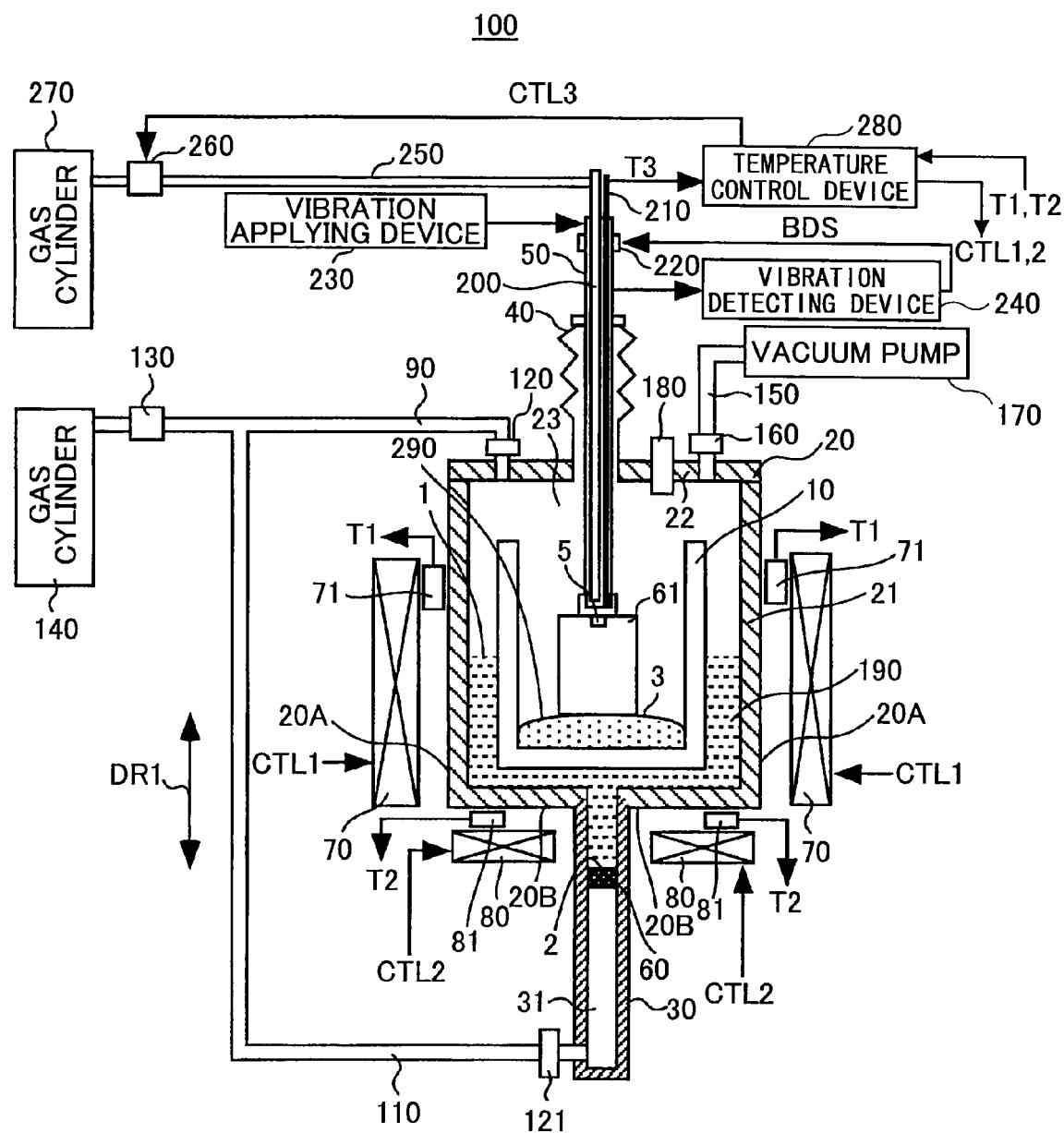
FIG. 27 is a diagram showing the state of the reaction container and the external reaction container at the end of preparation of a GaN crystal according to the flowchart shown in FIG. 24.

FIG. 27 shows the state of the reaction container 10 and the external reaction container 20 at the end of preparation of the GaN crystal according to the flowchart shown in FIG. 24. As shown in FIG. 27, when the crystal growth of the GaN crystal 6 advances and all the metal Ga in the mixed molten metal 290 is consumed, the mixed molten metal 290 contains only metal Na and the gas-liquid interface 3 does not fall further. At this time, the size of the GaN crystal 6 which is produced through crystal growth from the seed crystal 5 becomes large so that the GaN crystal 61 is prepared.

The relation between the amount of impurities contained in the GaN crystal 61 produced according to the flowchart shown in FIG. 24 and the Ar-gas purification patterns (A)-(H) is shown in Table 1 below.

TABLE 1

|  | Concentration of $O_2$ & $H_2O$ in Ar Gas [ppm]: | Amount of O & H in GaN Crystal [$cm^{-3}$]: |
|---|---|---|
| Spl.1: | $O_2 = 0.1$-10, $H_2O = 0.1$-10 | $O = 10^{18}$-$10^{20}$, $H = 10^{19}$-$10^{20}$ |
| Spl.2: | $O_2 =$ below 0.1, $H_2O = 0.1$-10 | $O = 10^{18}$-$10^{20}$, $H = 10^{19}$-$10^{20}$ |
| Spl.3: | $O_2 = 0.1$-10, $H_2O =$ below 0.1 | $O = 10^{18}$-$10^{20}$, $H =$ below $10^{19}$ |
| Spl.4: | —, $H_2O = 0.1$-10 | $O = 10^{18}$-$10^{19}$, $H = 10^{19}$-$10^{20}$ |
| Spl.5: | $O_2 =$ below 0.1, $H_2O =$ below 0.1 | $O =$ below $10^{18}$, $H =$ below $10^{19}$ |
| Spl.6: | —, $H_2O =$ below 0.1 | $O =$ below $10^{18}$, $H =$ below $10^{19}$ |
| Spl.7: | $O_2 = 0.1$-10, — | $O = 10^{18}$-$10^{20}$, H: below limit |
| Spl.8: | $O_2 =$ below 0.1, — | $O =$ below $10^{18}$, H: below limit |

In the above Table 1, the amount of oxygen (O) and the amount of hydrogen (H) have been measured by using the SIMS (Secondary Ion Mass Spectroscopy).

In the above Table 1, the amounts of oxygen and the amounts of hydrogen for the samples Spl.1-Spl.8 of the GaN crystal 61 produced when purifying the Ar gas by using the purification patterns (A)-(H) are indicated respectively.

In this manner, the oxygen concentration and the hydrogen concentration in the GaN crystal 61 which is produced through crystal growth using the crystal preparing device 100 are controllable by controlling the oxygen concentration and the moisture concentration in the Ar gas contained in the interior space 301 of the glove box 300.

The samples Spl.1 and Spl.2 are the GaN crystals containing the amount of oxygen of $10^{18}$-$10^{20}$ $cm^{-3}$, and the amount of hydrogen of $10^{19}$-$10^{20}$ $cm^{-3}$. The sample Spl.4 is a GaN crystal containing the amount of oxygen of $10^{18}$-$10^{19}$ $cm^{-3}$, and the amount of hydrogen of $10^{19}$-$10^{20}$ $cm^{-3}$.

Thus, the samples Spl.1, Spl.2, and Spl.4 are the GaN crystals containing the amount of hydrogen of $10^{19}$-$10^{20}$ $cm^{-3}$. And the GaN crystal containing the amount of hydrogen of $10^{19}$-$10^{20}$ $cm^{-3}$ is analogous to an insulator. Therefore, the purification patterns (A), (B), and (D) are suitable when preparing a GaN crystal analogous to an insulator.

Moreover, the sample Spl.3 is a GaN crystal containing the amount of oxygen of $10^{18}$-$10^{20}$ $cm^{-3}$ and the amount of hydrogen below $10^{19}$ $cm^{-3}$. The sample Spl.7 is a GaN crystal containing the amount of oxygen of $10^{18}$-$10^{20}$ $cm^{-3}$ and the amount of hydrogen below the detectable limit.

Thus, the samples Spl.3 and Spl.7 contain the amount of oxygen of $10^{18}$-$10^{20}$ $cm^{-3}$. Since oxygen of $10^8$-$10^{20}$ $cm^{-3}$ may act as the n type dopant in a GaN crystal, each of the samples Spl.3 and Spl.7 is a low resistance GaN crystal. Therefore, the GaN crystal of each of the samples Spl.3 and Spl.7 is suitable for the substrate when producing an optical device, such as a semiconductor laser, thereon.

Thus, since the GaN crystal used as the substrate for the optical device can be produced, when a semiconductor laser is produced on the GaN crystal, the electrode for pouring the current for laser oscillation into the active layer of the semiconductor laser can be formed in the thickness direction. The current can be poured into the active layer more efficiently than in the case where the electrode for current pouring is formed in the transverse direction, and the semiconductor laser in which the threshold current for laser oscillation is reduced can be produced.

In addition, hydrogen functions to inactivate dopant in a GaN crystal, and the GaN crystal of the sample Spl.7 has a specific resistance which is lower than that of the GaN crystal of the sample Spl.3. In this manner, the amount of hydrogen below $10^{19}$ $cm^{-3}$ can function to control the specific resistance of a GaN crystal.

Furthermore, the samples Spl.5 and Spl.6 are the GaN crystals containing the amount of oxygen below $10^{18}$ $cm^{-3}$ and the amount of hydrogen below $10^{19}$ $cm^{-3}$, and the sample Spl.8 is a GaN crystal containing the amount of oxygen below $10^{18}$ $cm^{-3}$ and the amount of hydrogen below the detectable limit.

Thus, the samples Spl.5, Spl.6, and Spl.8 contain the amount of oxygen below $10^{18}$ $cm^3$. And the amount of oxygen below $10^{18}$ $cm^{-3}$ does not act as n type dopant in a GaN crystal. Therefore, the samples Spl.5, Spl.6, and Spl.8 include a high resistance GaN crystal, and they are suitable for producing an electronic device, such as a field-effect transistor.

The GaN crystals of all the samples Spl.1-Spl.8 mentioned above have a dislocation density of below $10^3$ $cm^{-2}$. Some of them may contain metal Na (alkali metal), others may not contain metal Na (alkali metal).

Thus, by controlling the oxygen concentration and the moisture concentration of Ar gas contained in the glove box 300, it is possible to produce a GaN crystal having a dislocation density of $10^3$ $cm^{-2}$ or less and containing oxygen in a concentration of $10^{20}$ $cm^{-3}$ or less (the samples Spl.7 and Spl.8), or it is possible to produce a GaN crystal having a dislocation density of $10^3$ $cm^{-2}$ or less and containing oxygen of $10^{20}$ $cm^{-3}$ or less and hydrogen of $10^{20}$ $cm^{-3}$ or less (the samples Spl.1-Spl.6).

Therefore, according to this embodiment, the oxygen concentration and the hydrogen concentration of Ar gas in the glove box 300 are controlled, and any of an insulator, a low resistance GaN semiconductor, and a high resistance GaN semiconductor can be produced and a GaN crystal appropriate for use in optical devices or electronic devices can be produced.

Although the mutual reaction is prevented, metal Ga and metal Na are put in to the reaction container 10 and it explained that a GaN crystal is produced, the intermetallic compound of not only this but the metal Ga and metal Na is put into the reaction container 10, and it is possible to produce a GaN crystal according to the above embodiment of the invention.

The metal Ga and the metal Na are placed into the reaction container 10 within the glove box, and an intermetallic compound is produced by heating temperature at 100 degrees C. or higher. At this time, the intermetallic compound of $Na_5Ga_8$ is produced by setting the ratio of Na and Ga to 5:8. This intermetallic compound is in the form of powders.

The produced powdered intermetallic compound may be put into the new reaction container 10 in the glove box 300, the reaction container 10 and the external reaction container 20 may be set in the crystal preparing device 100, so that a GaN crystal may be produced.

In addition, in the flowchart shown in FIG. 24, when the reaction container 10 and the external reaction container 20 are heated to 800 degrees C., the seed crystal 5 is contacted to the mixed molten metal 290 containing metal Na and metal Ga (steps S5 and S6 in FIG. 24). Alternatively, when the reaction container 10 and the external reaction container 20 are heated to 800 degrees C. (step S5), the seed crystal 5 may be held in the mixed molten metal 290 containing metal Na and metal Ga in step S6. That is, when the reaction container 10 and the external reaction container 20 are heated to 800 degrees C., the seed crystal 5 is immersed in the mixed molten metal 290, so that crystal growth of a GaN crystal from the seed crystal 5 may be performed.

And the operation which contacts the seed crystal 5 to the mixed molten metal 290 includes step A which detects a vibration detection signal BDS indicating vibrations of the supporting device 50, by applying vibrations to the supporting device 50 using the vibration applying device 230, as well as step B which moves the supporting device 50 using the up-and-down movement device 220 so that the detected vibration detection signal BDS may be an vibration detection signal (the signal component SS2 of the vibration detection signal BDS) when the seed crystal 5 touches the mixed molten metal 290.

Moreover, the operation which holds the seed crystal 5 in the mixed molten metal 290 includes step A which detects a vibration detection signal BDS indicating the vibrations of the supporting device 50, by applying vibrations to the supporting device 50 using the vibration applying device 230, as well as step C which moves the supporting device 50 using the up-and-down movement device 220 so that the detected vibration detection signal BDS may be an vibration detection signal (the signal component SS3 of the vibration detection signal BDS) when the seed crystal 5 is immersed in the mixed molten metal 290.

The supporting device 50 is moved using the up-and-down movement device 220 in the above step B and the above step C. According to the relation between the capacity of the reaction container 10 and the total amount of metal Ga and metal Na contained in the reaction container 10, the position of the liquid surface (=the interface 3) of the mixed molten metal 290 within the reaction container 10 is changed and when the mixed molten metal 290 is produced within the reaction container 10, the seed crystal 5 may be held in the space 23 or the seed crystal 5 may be immersed in the mixed molten metal 290. In order to immerse the seed crystal 5 in the mixed molten metal 290 or to contact the seed crystal 5 with the mixed molten metal 290, it is necessary to move the seed crystal 5 up or down in the gravity direction DR1.

Moreover, in step S10 of the flowchart in FIG. 24, the seed crystal 5 is dropped so that the seed crystal 5 contacts the mixed molten metal 290. Generally, the step S10 of the flowchart in FIG. 24 includes step D which moves the supporting device 50 using the up-and-down movement device 220 so that a GaN crystal which is produced through crystal growth from the seed crystal 5 contacts the mixed molten metal 290 during the crystal growth of the GaN crystal.

Although Ga in the mixed molten metal 290 is consumed and the liquid surface (=interface 3) of the mixed molten metal 290 is lowered with the crystal growth of the GaN crystal. The GaN crystal which is produced through crystal growth from the seed crystal 5 may be moved downward or the GaN crystal which is produced through crystal growth from the seed crystal 5 may be moved upward in accordance with the relation between the speed at which the liquid surface (=interface 3) falls and the crystal growth speed of the GaN crystal.

That is, when the falling speed of the liquid surface (=interface 3) is higher than the crystal growth speed of the GaN crystal, the GaN crystal which is produced through crystal growth from the seed crystal 5 is moved downward, so that the GaN crystal is contacted with the liquid surface (=interface 3) of the mixed molten metal 290. On the other hand, when the falling speed of the liquid surface (=interface 3) is slower than the crystal growth speed of the GaN crystal, the GaN crystal which is produced through crystal growth from the seed crystal 5 is moved upward, so that the GaN crystal is contacted with the liquid surface (=interface 3) of the mixed molten metal 290.

Thus, since it is necessary to move up or down the GaN crystal which is produced through crystal growth from the seed crystal 5 in the gravity direction DR1 in accordance with the relation between the falling speed of the liquid surface (=interface 3) and the crystal growth speed of the GaN crystal, the supporting device 50 is moved using the up-and-down movement device 220" in the above step D.

And in the above step D, the operation which contacts the GaN crystal which is produced through crystal growth from the seed crystal 5 to the mixed molten metal 290 includes the above step A and the above step B.

As mentioned above, a GaN crystal with a controlled amount of oxygen and/or a controlled amount of hydrogen can be produced by controlling the oxygen concentration and/or the moisture concentration of Ar gas in the glove box 300 when placing metal Na and metal Ga into the reaction container 10. According to this feature, a GaN crystal appropriate for use in optical devices or electronic devices can be produced.

Moreover, the crystal preparing device 100 of this embodiment is characterized by growing up a GaN crystal where metal Na vapor 7 is enclosed in the space 23. According to this feature, evaporation of metal Na from the mixed molten metal 290 can be controlled, the rate of a mole ratio of metal Na and metal Ga in the mixed molten metal 290 can be held almost uniformly, and a quality GaN crystal having a large size can be produced.

Furthermore, the crystal preparing device 100 of this embodiment is characterized by setting the temperature T3 of the seed crystal 5 to a temperature lower than the temperature (or the temperature of the heaters of the heating devices 70 and 80) of the reaction container 10 and the external reaction container 20, so that a GaN crystal is produced.

According to this feature, it is controllable so that the degree of supersaturation of the nitrogen in the mixed molten metal 290 of the seed crystal 5 neighborhood or group III nitride is made high while a GaN crystal is produced from the seed crystal 5. That is, it is controllable to prevent occurrence of a core other than the seed crystal 5, and a GaN crystal is produced only from the seed crystal 5. As a result, the GaN crystal having a large size can be produced. And the seed crystal 5 is lowered using the up-and-down movement device 220 so that the seed crystal 5 may contact the mixed molten metal 290 during crystal growth of a GaN crystal. It is possible to hold the state in which a GaN crystal is produced preferentially from the seed crystal 5. As a result, the GaN crystal having a large size can be produced.

Furthermore, the temperature T4 in the crystal preparing device 100 of the gas-liquid interface 1 of the space 23 in the external reaction container 20, and the molten metal 190 or the gas-liquid interface 1 neighborhood is substantially equal to the temperature T5 in the gas-liquid interface of the space 23 and the mixed molten metal 290 or the gas-liquid interface 3 neighborhood, the heating device 70 heats the reaction container 10 and the external reaction container 20.

Thus, by making the temperature T5 in the gas-liquid interface 3 or the gas-liquid interface 3 neighborhood substantially equal to the temperature T4 in the gas-liquid interface 1 or the gas-liquid interface 1 neighborhood, the metal Na vapor which evaporated from molten metal 190, and the metal Na vapor which evaporated from the mixed molten metal 290 will be in equilibrium in space 23, and it can control that metal Na vapor of the gas-liquid interface 3 neighborhood diffuses in the direction of the gas-liquid interface 1.

As a result, evaporation of metal Na from the mixed molten metal 290 is controlled certainly, the rate of a mole ratio of metal Na and metal Ga in the mixed molten metal 290 can be stabilized, it is stabilized and the GaN crystal which has large size can be produced.

Furthermore, in the crystal preparing device 100, the reaction container 10 and the external reaction container 20 may be heated so that the temperature T4 is higher than the temperature T5. In this case, a heating device is further installed between the reaction container 10 and the external reaction container 20, the reaction container 10 is heated with that installed heating device, the gas-liquid interface 3 or the gas-liquid interface 3 neighborhood is heated to temperature T5, and the gas-liquid interface 1 or the gas-liquid interface 1 neighborhood is heated to temperature T4 with the heating device 70.

Thus, by setting the temperature T4 to a temperature higher than the temperature T5, the vapor pressure of metal Na in the gas-liquid interface 1 becomes higher than the vapor pressure of metal Na in the gas-liquid interface 3, and metal Na vapor diffuses from the gas-liquid interface 1 neighborhood to the gas-liquid interface 3 neighborhood. In this case, the gas-liquid interface 3 neighborhood, the concentration of metal Na vapor becomes high and can control further evaporation of metal Na from the mixed molten metal 290. As a result, the rate of a molar ratio of metal Na and metal Ga in the mixed molten metal 290 can be stabilized certainly, it is stabilized and the GaN crystal having a large size can be produced.

Therefore, in the crystal preparing device 100, the temperature T4 is set to be higher than the temperature T5, and preparation of a GaN crystal is performed.

In the above embodiment, vibrations are applied to the supporting device 50 and vibrations of the supporting device 50 are detected so that the seed crystal 5 or the GaN crystal 6 contacts the mixed molten metal 290. Alternatively, the position of the gas-liquid interface 3 may be detected, and the seed crystal 5 or the GaN crystal 6 may be contacted with the mixed molten metal 290. In this case, the current is sent through the lead wire in the state of lead wire where connected the end to the external reaction container 20 from the outside, and the end is made immersed into the mixed molten metal 290, and the length of the lead wire into which it is put in the external reaction container 20 in case the current switches from OFF to ON detects the position of the gas-liquid interface 3.

If the other end of lead wire is immersed in the mixed molten metal 290, the current flows into lead wire through the mixed molten metal 290, the reaction container 10, molten metal 190, and the external reaction container 20 and the other end of lead wire is not immersed in the mixed molten metal 290, current does not flow into the lead wire.

Therefore, the position of the gas-liquid interface 3 is detectable with the length of the lead wire put in the external reaction container 20 when application of the current is switched from OFF to ON. And if the position of the gas-liquid interface 3 is detected, the seed crystal 5 or the GaN crystal 6 is dropped to the position of the detected the gas-liquid interface 3 using the up-and-down movement device 220.

Alternatively, a sound wave may be generated and applied to the gas-liquid interface 3, and the time for the sound wave to go and come back between the gas-liquid interfaces 3 is measured, so that the position of the gas-liquid interface 3 is detected.

Furthermore, it is possible to detect the position of the gas-liquid interface 3 from the length of the thermocouple which is inserted into the reaction container 10 from the external reaction container 20 when the temperature detected by the thermocouple is changed.

Moreover, the temperature of the seed crystal 5 is lower than the temperature of the mixed molten metal 290 by cooling the seed crystal 5 in the above embodiment. Alternatively, a heater may be installed in the piping 200 to control the temperature of the seed crystal 5 by this heater. When the reaction container 10 and the external reaction container 20 are heated with the heating devices 70 and 80, the temperature of the seed crystal 5 may not rise like the temperature of the mixed molten metal 290. In such a case, the seed crystal 5 is heated by using the heater installed in the piping 200, so that it is controlled so that the temperature of the seed crystal 5 changes according to the curve k2 or the straight line k3 shown in FIG. 7.

Therefore, the heating devices 70 and 80 and the heater in the piping 200 may be controlled so that the difference between the temperature of the mixed molten metal 290 and the temperature of the seed crystal 5 matches with a difference in temperature between the straight line k1 and the curve k2 shown in FIG. 7, or a difference in temperature between the straight line k1 and the straight line k3 shown in FIG. 7.

Furthermore, in the above embodiment, the height H of the convex part 62 of the control/introduction plug 60 and the gap d of the convex parts 62 is on the order of tens of micrometers. Alternatively, the height H of the convex part 62 and the gap d of the convex parts 62 may be determined according to the temperature of the control/introduction plug 60. In this case, when the temperature of the control/introduction plug 60 is relatively high, the height H of the convex part 62 is relatively made high, and the gap d of the convex parts 62 temperature of the control/introduction plug 60 is relatively low, the height H of the convex part 62 is relatively made low and the gap d of the convex parts 62 is made relatively large.

That is, when the temperature of the control/introduction plug 60 is relatively high, the size of the air gap 63 between the control/introduction plug 60 and the piping 30 is made relatively small, and when the temperature of the control/introduction plug 60 is relatively low, the size of the air gap 63 between the control/introduction plug 60 and the piping 30 is made relatively large.

The size of the air gap 63 is determined according to the height H of the convex part 62 and the gap d of the convex parts 62, and the size of the air gap 63 which can hold the molten metal 190 using the surface tension changes in accordance with the temperature of the control/introduction plug 60. Therefore, the height H of the convex part 62 and the gap d of the convex parts 62 are changed according to the temperature of the control/introduction plug 60, and it is possible to hold the molten metal 190 certainly by using the surface tension.

And the control of the temperature of the control/introduction plug 60 is performed by the heating device 80. That is, in increasing the temperature of the control/introduction plug 60 to a temperature higher than 150 degrees C., the control/introduction plug 60 is heated by using the heating device 80.

Moreover, in the above embodiment, metal Na and metal Ga are placed into the reaction container 10 in the Ar gas atmosphere containing a predetermined amount of impurities, and metal Na is placed between the reaction container 10 and the external reaction container 20 in the Ar gas atmosphere containing the predetermined amount of impurities. Alternatively, metal Na and metal Ga are placed into the reaction container 10 in a nitrogen gas atmosphere which contains gas other than Ar gas, such as He, Ne, Kr, etc. and contains a predetermined amount of impurities, and metal Na may be placed between the reaction container 10 and the external reaction container 20. Generally, it is adequate to place metal Na and metal Ga into the reaction container 10 in the nitrogen gas atmosphere containing a predetermined amount of impurities or the inert gas containing a predetermined amount of impurities, and to place metal Na between the reaction container 10 and the external reaction container 20.

The present invention is not limited to the above-described embodiments, and variations and modifications may be made without departing from the scope of the present invention.

What is claimed is:

1. A crystal preparing method which produces a group III nitride crystal using a crystal preparing device, the crystal preparing device including a crucible holding a mixed molten metal containing alkali metal and group III metal, a reaction container having a container space which contacts the mixed molten metal and holding a molten alkali metal between the container space and an outside of the container, the molten alkali metal contacting the container space, and a piping disposed below the crucible and connected with the reaction container, the crystal preparing method comprising:
   a first step of placing the alkali metal and the group III metal into the crucible in an inert gas or nitrogen gas atmosphere;
   a second step of placing the alkali metal into the piping in the inert gas or nitrogen gas atmosphere;
   a third step of filling the container space of the reaction container with nitrogen gas;
   a fourth step of heating the crucible to a crystal growth temperature;
   a fifth step of heating the molten alkali metal at a specific temperature at which a vapor pressure of the alkali metal which evaporates from the molten alkali metal is substantially equal to a second vapor pressure of the alkali metal which evaporates from the mixed molten metal; and
   a sixth step of holding a temperature of the crucible to the crystal growth temperature, and holding a temperature of the molten alkali metal to the specific temperature for a predetermined time.

2. The crystal preparing method according to claim 1, wherein the specific temperature is lower than the crystal growth temperature.

3. The crystal preparing method according to claim 1, wherein the crystal preparing device further includes a molten metal holding member provided in the piping to hold the molten alkali metal by a surface tension of the alkali molten metal, and wherein the second step is provided to place the alkali metal between the crucible and the reaction container so that the molten alkali metal containing the alkali metal is held at least in the piping.

4. The crystal preparing method according to claim 3, wherein the second step is provided to place the alkali metal between the crucible and the reaction container so that the molten alkali metal containing the alkali metal is held only in the piping.

5. The crystal preparing method according to claim 1 further comprising a seventh step of supplying nitrogen gas to the container space through the molten alkali metal after the fifth step is performed.

* * * * *